(12) United States Patent
Kruit

(10) Patent No.: US 10,312,052 B2
(45) Date of Patent: Jun. 4, 2019

(54) MULTI ELECTRON BEAM INSPECTION APPARATUS

(71) Applicant: TECHNISCHE UNIVERSITEIT DELFT, Delft (NL)

(72) Inventor: Pieter Kruit, Delft (NL)

(73) Assignee: TECHNISCHE UNIVERSITEIT DELFT (NL)

( * ) Notice: Subject to any disclaimer, the term of this patent is extended or adjusted under 35 U.S.C. 154(b) by 0 days.

(21) Appl. No.: 15/507,661

(22) PCT Filed: Sep. 3, 2015

(86) PCT No.: PCT/NL2015/050610
§ 371 (c)(1),
(2) Date: Mar. 23, 2017

(87) PCT Pub. No.: WO2016/036246
PCT Pub. Date: Mar. 10, 2016

(65) Prior Publication Data
US 2017/0243717 A1    Aug. 24, 2017

(30) Foreign Application Priority Data

Sep. 4, 2014   (NL) .................................... 2013411

(51) Int. Cl.
*H01J 37/28* (2006.01)
*H01J 37/04* (2006.01)

(52) U.S. Cl.
CPC ..... *H01J 37/28* (2013.01); *H01J 2237/24592* (2013.01); *H01J 2237/2817* (2013.01);
(Continued)

(58) Field of Classification Search
CPC .... H01J 37/3177; H01J 37/147; H01J 37/045; H01J 37/145; H01J 37/1471;
(Continued)

(56) References Cited

U.S. PATENT DOCUMENTS

| 6,335,783 B1 * | 1/2002 | Kruit ..................... B82Y 10/00 |
| | | 250/492.2 |
| 6,774,646 B1 | 8/2004 | Han et al. .................... 324/751 |

(Continued)

FOREIGN PATENT DOCUMENTS

| CN | 101593658 | 12/2009 | .............. H01J 37/04 |
| EP | 2128885 | 12/2009 | .............. H01J 37/05 |

(Continued)

OTHER PUBLICATIONS

International Search Report and Written Opinion issued in application No. PCT/NL2015/050610, dated Apr. 7, 2016 (13 pgs).
(Continued)

*Primary Examiner* — David A Vanore
(74) *Attorney, Agent, or Firm* — Hayes Soloway P.C.

(57) ABSTRACT

Provided is an assembly for inspecting the surface of a sample. The assembly includes two or more multi-beam electron column units. Each unit has: a single thermal field emitter for emitting a diverging electron beam towards a beam splitter; wherein the beam splitter includes a first multi-aperture plate having multiple apertures for creating multiple primary electron beams; a collimator lens for collimating the diverging electron beam from the emitter; an objective lens unit for focusing said multiple primary electron beams on said sample; and a multi-sensor detector system for separately detecting the intensity of secondary electron beams created by each one of said focused primary electron beams on said sample. The two or more multi-beam electron column units are arranged adjacent to each other for inspecting different parts of the surface of the sample at the same time.

31 Claims, 12 Drawing Sheets

(52) U.S. Cl.
CPC ............... *H01J 2237/31774* (2013.01); *H01J 2237/31798* (2013.01)

(58) Field of Classification Search
CPC ....... H01J 2237/0453; H01J 2237/0435; H01J 2237/04756; H01J 2237/31774; H01J 2237/04924; H01J 2237/1205; H01J 2237/1508; H01J 2237/2447; H01J 2237/28; G21K 1/087; G21K 5/04; G01N 23/225; G01N 23/2251; G01N 23/22; G01N 2223/646
USPC ......... 250/310, 396 R, 311, 397, 306, 492.1, 250/394
See application file for complete search history.

(56) References Cited

U.S. PATENT DOCUMENTS

| | | | | |
|---|---|---|---|---|
| 6,787,772 | B2* | 9/2004 | Ose | H01J 37/147 850/9 |
| 7,244,949 | B2* | 7/2007 | Knippelmeyer | B82Y 10/00 250/396 ML |
| 7,504,622 | B2 | 3/2009 | Elyasaf et al. | 250/306 |
| 8,039,813 | B2 | 10/2011 | Casares et al. | 250/396 R |
| 8,153,996 | B2* | 4/2012 | Abe | B82Y 10/00 250/492.22 |
| 8,294,095 | B2* | 10/2012 | Chen | G01N 23/2251 250/310 |
| 8,350,214 | B2* | 1/2013 | Otaki | B82Y 10/00 250/310 |
| 8,461,525 | B2 | 6/2013 | Henstra | 250/305 |
| 8,598,545 | B2* | 12/2013 | Kruit | H01J 37/12 250/492.21 |
| 8,759,797 | B2* | 6/2014 | Muraki | H01J 37/317 250/397 |
| 8,927,949 | B2* | 1/2015 | Ogawa | H01J 37/244 250/310 |
| 9,263,233 | B2* | 2/2016 | Zeidler | H01J 37/28 |
| 9,299,533 | B2* | 3/2016 | Matsumoto | H01J 37/3007 |
| 9,349,571 | B2* | 5/2016 | Kemen | H01J 37/10 |
| 9,691,588 | B2* | 6/2017 | Ren | H01J 37/28 |
| 2002/0009901 | A1 | 1/2002 | Maehara et al. | 438/795 |
| 2005/0269528 | A1* | 12/2005 | Kruit | B82Y 10/00 250/492.22 |
| 2006/0016989 | A1* | 1/2006 | Nakasuji | G01N 23/2251 250/310 |
| 2007/0023654 | A1* | 2/2007 | Kamimura | B82Y 10/00 250/310 |
| 2008/0191142 | A1* | 8/2008 | Pedroni | A61N 5/1049 250/396 ML |
| 2008/0230697 | A1* | 9/2008 | Tanimoto | G01N 23/225 250/310 |
| 2009/0001267 | A1* | 1/2009 | Enyama | G01N 23/22 250/310 |
| 2009/0114818 | A1* | 5/2009 | Casares | H01J 37/045 250/307 |
| 2010/0133433 | A1* | 6/2010 | Tanimoto | H01J 37/244 250/310 |
| 2010/0320382 | A1 | 12/2010 | Almogy et al. | 250/307 |
| 2011/0147608 | A1* | 6/2011 | Balakin | A61N 5/10 250/396 R |
| 2011/0233423 | A1* | 9/2011 | Balakin | G21K 1/087 250/454.11 |
| 2011/0284761 | A1* | 11/2011 | Balakin | A61N 5/10 250/396 R |
| 2011/0284762 | A1* | 11/2011 | Balakin | A61N 5/10 250/396 R |
| 2012/0231606 | A1 | 9/2012 | Nguyen et al. | 438/424 |
| 2013/0270438 | A1* | 10/2013 | Lanio | H01J 37/09 250/310 |
| 2015/0060662 | A1* | 3/2015 | Chen | H01J 37/145 250/307 |
| 2015/0179399 | A1* | 6/2015 | Kruit | H01J 37/244 250/307 |
| 2015/0270095 | A1* | 9/2015 | Kruit | G01N 23/2251 250/307 |
| 2017/0243717 | A1* | 8/2017 | Kruit | H01J 37/28 |

FOREIGN PATENT DOCUMENTS

| | | | | |
|---|---|---|---|---|
| WO | WO2004017355 | | 2/2004 | ............. H01J 37/28 |
| WO | WO2006009444 | | 1/2006 | ............. H01L 21/66 |

OTHER PUBLICATIONS

Chinese Search Report from corresponding Chinese Patent Application Serial No. 201580057918.2, dated May 28, 2018 (2 pages).

* cited by examiner

MULTI ELECTRON BEAM INSPECTION APPARATUS

BACKGROUND

The invention relates to an assembly for inspecting a surface of a sample.

One of the routine steps in the production process of integrated circuits is the inspection of patterned surfaces, especially when starting up a new design. A substantial part of the whole 300 mm wafer is imaged to check for defects in the pattern and for particles imbedded in the pattern or on top of the wafer. This kind of inspection is presently performed by high-throughput optical microscopy in dedicated instruments.

With the progress in lithography, the instruments must detect smaller and smaller defects and particles. A problem is that the light scattering from particles rapidly decreases when the particle's size decreases, so the signal-to-background (and noise) ratio is decreasing.

In order to solve this problem, electron beam inspection machines have been used and for some purposes are still in use. Electron beam inspection machines can have a much higher resolution than optical system. However, electron beam inspection machines are limited in the speed at which they can inspect a wafer. In order to increase the speed, multi-column electron beam systems have been proposed.

WO 2004/017355, for example, discloses an example of an electron optics assembly for a multi-column electron beam inspection tool having about 52 electron beam columns which are distributed over an area of the semiconductor wafer. Each column comprises its own electron gun. According to WO 2004/017355 it is advantageous that the assembly comprises one or more electron optical components which are single structures for the whole assembly of electron beam columns, such as the first accelerator electrode, the final accelerator electrode, the focus electrode mounting plate and the gun mounting plate. These single structures provide mechanical integrity to the electron optics assembly and facilitates the manufacturing of the assembly.

Due to the use of 52 electron beam columns, productivity can be increased. However, for an electron beam inspection apparatus having a throughput in the order of one wafer per hour, for example, this number of electron beam columns is too little, as illustrated below:

To make an image with a reasonable signal-to-noise ratio, in the order of 300 to 400 primary electrons per pixel are needed (accounting for a quantum detection efficiency of about 0.3). A semiconductor wafer with a diameter of 300 mm contains approximately $7 \times 10^{14}$ pixels of $10 \times 10$ nm for detecting a 10 nm defect. For obtaining a throughput of one wafer per hour, a current of approximately 10 µA is required. The actual required current depends on many factors such as the defect contrast, choice of beam size and required defect capture rate. However, the required current will be in this order of magnitude.

The typical currents in electron microscopes with high brightness sources are in the order of nA's. Thus, the desired throughput of 1 wafer per hour can only be obtained using for example 10,000 electron beam columns or more in parallel. Such a system requires that the electron beam columns are miniaturized to a column footprint of approximately 7 mm², which is difficult and costly to manufacture.

It is an object of the present invention to provide an alternative inspection apparatus, which allows for high throughput inspection of samples, in particular semiconductor wafers.

SUMMARY OF THE INVENTION

The present invention provides an assembly comprising multiple multi-beam electron column units for inspecting different parts of the surface of the sample at the same time. The invention also includes several novel aspects of multi-beam electron column units, including the design of a separate high vacuum chamber for said single thermal field emission source, the design of a correction device for correcting a drift of said emission source, and the design of the secondary electron collection and detection system.

According to a first aspect, the present invention relates to an assembly for inspecting the surface of a sample, wherein the assembly comprises two or more multi-beam electron column units, each multi-beam electron column unit comprising:

a single thermal field emission source, preferably of the Schottky type, for emitting a diverging electron beam towards a beam splitter, the beam splitter comprises a first multi-aperture plate comprising multiple apertures which are arranged for creating multiple primary electron beams, one primary electron beam per aperture of said first multiple apertures, a collimator lens for substantially collimating the diverging electron beam from the emitter, an objective lens unit for focusing said multiple primary electron beams on said sample, and a multi-sensor detector system for separately detecting the intensity of secondary electron beams created by each one of said focused primary electron beams on said sample, wherein said two or more multi-beam electron column units are arranged adjacent to each other, and are arranged to focus their multiple primary electron beams onto the surface of the sample for inspecting different parts of the surface of the sample at the same time.

It is noted that multi-beam electron columns, as such, are known. Examples of such systems are inter alia disclosed in U.S. Pat. Nos. 6,774,646, 7,504,622, 8,039,813, US 2010/0133433, US 2010/0320382, US 2012/0231606, and WO 2006/009444. It is noted that present day multi electron beam columns typically have a diameter in the same order of magnitude as a 300 mm semiconductor wafer, and can be arranged to provide thousands of electron beams onto a sample, at least in theory.

Instead of using one multi electron beam column as known from the prior art, the invention proposes to use an assembly comprising multiple multi electron beam columns. A person skilled in the art knows that due to the use of the first multi-aperture plate for creating multiple primary electron beams, a substantial part of the current produced by the electron source is blocked by said first multi-aperture plate. With this in mind it is clear that a high-brightness electron gun, such as a cold field emitter or a Schottky-type gun, cannot provide sufficient total current for 10,000 electron beams. Electron guns that do provide sufficient total current do not have the required brightness.

This limitation has been put aside by the present invention. The assembly according to the present invention offers a solution that allows the use of high brightness thermal field emission (TFE or "Schottky-type") electron sources with as few sources as possible. Since a single TFE source can deliver sufficient current for 100 to 1000 probes having a current of approximately 1 nA, a total number of 10 to 100 TFE sources is sufficient to fulfill the requirements of a high throughput inspection apparatus.

A division of 10,000 beams in, for example, 100 units of 100 electron beams each, is also advantageous from the data transport point of view. With a 1 nA beam, the pixel rate for 400 electrons per pixel is $16 \times 10^6$ s$^{-1}$. For a 100 electron beam unit this gives about 1 GB/s data. This is appropriate for a single data line and processing unit. Accordingly, in an embodiment, at least one of the two or more multi-beam electron column units comprises a single signal processing unit which is connected to the multi-sensor detector system of said one of the two or more multi-beam electron column units. Preferably, said one of the two or more multi-beam electron column units is connected to a central signal processing unit of the assembly via a single signal line or data line.

In an embodiment, the beam splitter comprises a first electrode which together with the first multi-aperture plate provides a first electrostatic lens array, wherein substantially each aperture of said first multi-aperture plate in use comprises an electrostatic lens, and wherein the electrostatic lenses of the first electrostatic lens array are arranged to focus the multiple primary electron beams in a first focus plane. In this embodiment the function of the beam splitter is combined with a function of an electrostatic lens array for providing a focusing lens for each aperture in the first multi-aperture plate, and thus for each electron beam in the multi electron beam column unit. In use, the electron beams of said multi electron beam unit are focused in the first focus plane, which is preferably arranged at a position between the TFE source and the objective lens unit.

In an embodiment, the first focus plane is arranged in or near the collimator lens unit. In use, the individual electron beams are focused in or near the collimator lens, which is preferably a single lens for all electron beams in said multi electron beam unit, also denoted herein as a macro lens. By arranging the first focus plane in or near the collimating macro lens, distortions of the individual electron beams due to aberrations of the macro lens, can be reduced to a large extend.

In an embodiment, the objective lens unit comprises a second electrostatic lens array for focusing said multiple primary electron beams on the surface of the sample, wherein the second electrostatic lens array comprises at least a second multi-aperture plate, wherein substantially each aperture of said second multi-aperture plate in use comprises an electrostatic lens. Thus the objective lens unit comprises an array of electrostatic lenses, in particular one electrostatic lens for each individual electron beam.

In an embodiment, said second electrostatic lens array comprises a second electrode at a distance from the second multi-aperture plate, wherein said second electrode comprises a multi-aperture plate having an array of apertures which are aligned with the apertures of the second multi-aperture plate. The apertures are aligned in order to provide passage of one of the multiple primary electron beams through one aperture of the multi-aperture plate of the second electrode and one associated aperture of the second multi-aperture plate. In use, said second electrode is set at a different voltage with respect to the second multi-aperture plate. Said voltage difference yields an electric field between the second electrode and the second multi-aperture plate, which electric field act as a lens for the electron beam traveling through said one aperture of the multi-aperture plate of the second electrode and said associated aperture of the second multi-aperture plate. Using at least two of such aligned multi-aperture plates provides an array of well-defined electrostatic lenses for accurately focusing each one of the multiple primary electron beams onto the surface of the sample.

In an embodiment, said second electrostatic lens array comprises a second electrode at a distance from the second multi-aperture plate, wherein said second electrode comprises a single hole for passing said multiple primary electron beams there through. In use, said second electrode is set at a different voltage from the second multi-aperture plate. The second electrostatic lens array according to this embodiment is more easy to manufacture and to align, in comparison to an electrostatic lens array having a stack of two multi-aperture plates.

In an embodiment, said second multi-aperture plate, in use, is set at a different voltage from the surface of the sample in order to provide an electrostatic deceleration field between the second multi-aperture plate and the surface of the sample, which is smaller than an electrostatic deceleration field between the nearest electrode at a side of said multi-aperture plate facing away from the sample and the second multi-aperture plate. In an embodiment said nearest electrode is the second electrode. This deceleration field for the primary electron beams provides an acceleration field for the secondary electrons from the sample, which acceleration field is used to direct the secondary electrons towards the multi-sensor detection system of said multi-beam electron column unit.

In an embodiment, the second electrostatic lens array comprises a series of second electrodes all arranged at a different distance from the second multi-aperture plate. In an embodiment, said series comprises more than two second electrodes, preferably four second electrodes. By providing, in use, suitable voltage differences between adjacent ones of said series of second electrodes, the objective lens unit can be optimized to accurately focus the primary electron means onto the surface of the sample, and in addition to suitably collect the secondary electrons from the sample into secondary electron beams.

In an embodiment, each multi-beam electron column unit further comprising an electro-magnetic deflection unit for aligning the multiple primary electron beams from said beam splitter onto the centers of the lenses in said second electrostatic lens array. In a multi-beam electron column having both the first and second multi-aperture plates, the electron beams originating from the apertures of the first multi-aperture plate must be correctly aligned on the apertures of the second multi-aperture plate. By providing an electro-magnetic deflection unit, any deviation or drift between the alignment between the first and second multi-aperture plate can be corrected by the electro-magnetic deflection unit.

In an embodiment, the electro-magnetic deflection unit is arranged for providing a substantial equal deflection for all primary electron beams of said multiple primary electron beams. An advantage of such a substantial equal deflection for all electron beams of said multi-beam electron column unit is, that only one deflection signal is needed for controlling the substantial equal deflection of all electron beams. In an embodiment, said deflection signal comprises at least one of a potential and a current.

In an embodiment, each multi-beam electron column unit comprises two of said electro-magnetic deflection units, wherein the direction of deflection of said two electro-magnetic deflection units is substantially perpendicular to each other. Using this combination of two electro-magnetic deflection units, the array of electron beamlets can be deflected in two substantially orthogonal directions, which allows to position the array of electron beamlets on any position on a plane downstream of the deflection units, in particular on the desired position on the objective lens unit for focusing said multiple primary electron beams on said sample.

In an embodiment, said multi-beam electron columns comprise an array of individually adjustable deflection elements for steering the multiple primary electron beams from said beam splitter onto the centers of the lenses in said second electrostatic lens array.

In an embodiment, the collimator lens is a combined magnetic and electrostatic collimator electron lens for adjusting the pitch and rotation of the multiple primary electron beams created by said beam splitter to the pitch and rotation position of the centers of the lenses in said second electrostatic lens array. Preferably the collimator lens comprises a coil with one or more windings, which coil is arranged in a plane substantially perpendicular to a longitudinal center line of said multi-beam electron column unit, wherein a center or center line of the coil substantially coincides with the longitudinal center line of said multi-beam electron column unit. In an embodiment, said one or more windings of said coil are arranged on a substantially planar substrate, for example a Silicon wafer, which is provided with one or more through openings for passing said electron beam(s) there through, wherein the coil is arranged substantially around said one or more through openings. In an embodiment said one or more through opening are provided with electrodes of an electro-magnetic deflection unit or with electrodes of an array of individually adjustable deflection elements.

In an embodiment, at least in use each lens of the second electrostatic lens array is arranged to project the secondary electrons from the sample on to the multi-sensor detector with one additional cross-over as compared to a primary electron beam. Preferably the second electrostatic lens array is arranged to project the secondary electrons onto the multi-sensor detector system, preferably the secondary electrons are defocused on the multi-sensor detector system. Preferably the multi-sensor detector system comprises multiple sensors at the area of said defocused spot of secondary electrons on said multi-sensor detector system. By using the off-center sensors to detect the of centre part of the defocused spot of secondary electrons, angular information of the studied sample can be obtained. In addition, or alternatively a dark-field image can be obtained using this setup.

In an embodiment, each of said multi-beam electron column units comprise an electro-magnetic deflection system between said collimator lens and said objective lens unit for deflecting the secondary electron beams towards said multi-sensor detector system. In an embodiment, the electro-magnetic deflection system is arranged for deflecting said secondary electron beams over an angle between 1 and 20 degrees, preferably over an angle of approximately 3 degrees. By using such a low deflection of the secondary electron beams, the multi-sensor detector system is arranged adjacent and close to the beam path of the primary electron beams, which allows a compact design and a small footprint of a multi-beam electron column unit.

In an embodiment, said electro-magnetic deflection system comprises a Wien deflector. Such a Wien deflector uses a magnetic field to disentangle the trajectories of the secondary electrons from the trajectories of the primary electrons. In order to deflect the secondary electrons over a small angle between 1 and 20 degrees, preferably over an angle of approximately 3 degrees, only a relatively weak magnetic field and/or in a relatively small magnetic field area through which the secondary and primary electrons in use traverse, is sufficient for disentangling their trajectories. Preferably, the magnetic field strength and/or the magnetic field area size which is arranged to deflect the low energy secondary electrons, is superposed with an electrostatic field arranged to compensate the influence of the magnetic field on the high energy primary electrons. The primary electrons traverse the Wien deflector substantially undeflected which provides several advantages. Firstly, the design of the electron optical column for the primary electron beams is relatively simple, for example using a substantially straight set-up with a substantially straight linear optical axis. Secondly, the alignment of the primary electron beams is substantially independent of the Wien deflector. And thirdly, such a straight design provides a small foot print, which allows to easily combine several multi-beam electron column units into an assembly according to the invention.

After the secondary electron beam paths are disentangled or split from the primary electron beam paths, the secondary electrons are directed to the multi-sensor detector system. Several different embodiments for such a multi-sensor detector system are proposed below:

In a first embodiment, said multi-sensor detector system comprises:

a fluorescent plate which is arranged for receiving the secondary electron beams on a first side of said fluorescent plate and for generating a substantially separate light emitting spot for each one of said secondary electron beams, and a multi-sensor detector arranged at a second side of said fluorescent plate facing away from the first side.

Preferably the multi-sensor detector is arranged directly on top of the fluorescent plate, preferably against the fluorescent plate, and/or connected to the fluorescent plate.

In a second embodiment, said multi-sensor detector system comprises:

a fluorescent plate or layer which is arranged for receiving the secondary electron beams and for generating a substantially separate light emitting spot for each one of said secondary electron beams, an array of optical fibers, wherein said fluorescent plate or layer is arranged adjacent or is attached to a first end of said array of optical fibers for coupling light from said substantially separate light emitting spots into the optical fibers, and a multi-sensor detector which is coupled to a second end of said array of optical fibers, opposite to said first end.

In a third embodiment, said multi-sensor detector system comprises:

a fluorescent plate which is arranged for receiving the secondary electron beams and for generating a substantially separate light emitting spot for each one of said secondary electron beams, and a mirror for imaging the light emitting spots on a multi-sensor detector. Such a mirror provides an efficient imaging of the light emitting spots on the fluorescent plate arranged in one focus point of the ellipse shaped mirror, onto a multi-sensor detector, such as a CCD sensor, arranged in the other focus point of the ellipse shaped mirror.

Preferably the mirror comprises a substantially ellipse shaped reflecting surface.

Preferably the mirror is provided with a through opening for allowing the primary electron beams and the secondary electron beams to pass through.

In all of these embodiments of the multi-sensor detector system, the multi-sensor detector preferably comprises at least one of a multi-pixel light detector such as a CCD camera, a CMOS camera, an array of avalanche photo diodes, and an array of photo multipliers.

In an embodiment, said multi-pixel detector system comprises a direct multi-pixel electron detector.

In an embodiment, each multi-beam electron column unit comprises a third multi-aperture plate arranged at or near the first focus plane, wherein said third multi-aperture plate comprises multiple apertures which are arranged for passing the focused primary electron beams there through, one focused electron beam per aperture of said third multiple apertures. In an embodiment, each multi-beam electron column unit comprises a chamber, wherein said single thermal field emission source and said beam splitter are arranged inside said chamber, and wherein said second multi-aperture plate provides a wall of said chamber. Said chamber separates the thermal field emission source from the vacuum environment in which the remaining parts of the multi-beam electron column unit and the sample is arranged.

Since the third multi-aperture plate is preferably arranged at or near the first focus plane, the apertures preferably have a very small diameter, for example smaller than 25 micron, preferably approximately 5 micron. Such small apertures of the third multi-aperture plate only provides a very limited leakage into the chamber, which allows to provide a much lower vacuum pressure inside the chamber comprising the thermal field emission source, with respect to the vacuum pressure of the vacuum environment.

In an embodiment, said chamber is connected to or comprises a vacuum pump. This vacuum pump allows to provide a very low vacuum pressure, also denoted as high vacuum, inside the chamber which is suitable for operating the thermal field emission source. The vacuum pressure of the vacuum environment around the chamber is in use arranged to be suitable for operating the inspection of the sample by the multiple electron beams, but this vacuum pressure can be higher than the vacuum pressure of in the chamber.

Preferably said vacuum pump connected to or part of the chamber, comprises an ion pump. Such a vacuum pump allows to obtain very low vacuum pressures, and can operate substantially without inducing vibrations to the multi-beam electron column unit.

In an embodiment, each multi-beam electron column unit comprises a deflector at or near the single thermal field emission source. This deflector is arranged to deflect the whole electron beam of the thermal field emission source and can be used for correcting any drift of the thermal field emission source during its lifetime. This deflector is especially practical for aligning and/or maintaining the correct alignment of the multiple electron beams to pass through the apertures of the third multi-aperture plate, which apertures are preferably very small, preferably having a diameter of 5 micron.

In an embodiment, the first aperture plate is provided with more apertures than the number of primary electron beams in the system, in particular when in use. In an embodiment the area of the first aperture plate which is provided with apertures is larger than the area on said first aperture plate which, in use, is illuminated by the diverging electron beam emitted by the single thermal emission source. The first aperture plate is thus provided with a number of spare apertures, preferably arranged around the apertures which in use create the multiple primary electron beams. These spare apertures can be used in case the drift of the single thermal field emission source becomes too large to be properly corrected by the deflector at or near the single thermal field emission source. If the drift becomes too large, the deflector is arranged to shift the whole diverging electron beam over a distance between two adjacent apertures of the first aperture plate in order to use one or more of said spare apertures in order to ensure that the required number of primary electron beams is maintained and an appropriate deflection range by the deflector is available in order to correct for any further drift. In an embodiment, the electro-magnetic deflection unit is used to deflect the array of shifted electron beams back and onto the objective lens unit.

In an embodiment, said multi-beam electron columns occupy a surface area above the surface of said sample in a range of 20×20 mm$^2$ to 60×60 mm$^2$, preferably approximately 26×32 mm$^2$.

In an embodiment, a pitch of said focused multiple primary electron beams on the surface of the sample is in a range from 50 to 500 μm, preferably approximately 150 μm.

According to a second aspect, the invention provides a multi-beam electron column unit for inspecting the surface of a sample, wherein the multi-beam electron column unit comprises:

a single thermal field emission source, preferably of the Schottky type, for emitting a diverging electron beam towards a beam splitter, wherein the beam splitter comprises a first multi-aperture plate comprising multiple apertures which are arranged for creating multiple primary electron beams, one primary electron beam per aperture of said first multiple apertures, wherein the beam splitter comprises a first electrode which together with the first multi-aperture plate provides a first electrostatic lens array, wherein substantially each aperture of said first multi-aperture plate in use comprises an electrostatic lens, and wherein the electrostatic lenses of the first electrostatic lens array are arranged to focus the multiple primary electron beams in a first focus plane, a further multi-aperture plate arranged at or near the first focus plane, wherein said further multi-aperture plate comprises multiple apertures which are arranged for passing the focused primary electron beams there through, one focused electron beam per aperture of said third multiple apertures a collimator lens for substantially collimating the diverging electron beam from the emitter, an objective lens unit for focusing said multiple primary electron beams on said sample, and a multi-sensor detector system for separately detecting the intensity of secondary electron beams created by each one of said focused primary electron beams on said sample, wherein the multi-beam electron column unit comprises a chamber, preferably a vacuum chamber, wherein said single thermal field emission source and said beam splitter are arranged inside said chamber, and wherein said further multi-aperture plate provides a wall of said chamber.

In an embodiment, said chamber is connected to or comprises a vacuum pump, wherein said vacuum pump preferably comprises an ion pump.

In an embodiment, said multi-beam electron column unit comprises a deflector at or near the single thermal field emission source, wherein said deflector is arranged for correcting a drift of said emission source.

According to a third aspect, the present invention provides a multi-beam electron column unit for inspecting the surface of a sample, wherein the multi-beam electron column unit comprises:

a single thermal field emission source, preferably of the Schottky type, for emitting a diverging electron beam towards a beam splitter, wherein the beam splitter comprises a first multi-aperture plate comprising multiple apertures which are arranged for creating multiple primary electron beams, one primary electron beam per aperture of said first multiple apertures, a collimator lens for substantially collimating the diverging electron beam from the emitter, an objective lens unit for focusing said multiple primary electron beams on said sample, and a multi-sensor detector system for separately detecting the intensity of secondary electron beams created by each one of said focused primary electron beams on said sample, wherein said multi-beam electron column unit comprises a deflector at or near the single thermal field emission source, wherein said deflector is arranged for correcting a drift of said emission source.

According to a fourth aspect, the present invention relates to a use of an assembly or a multi-beam electron column unit as described above for inspecting the surface of a sample, preferably the surface of a single semiconductor wafer.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
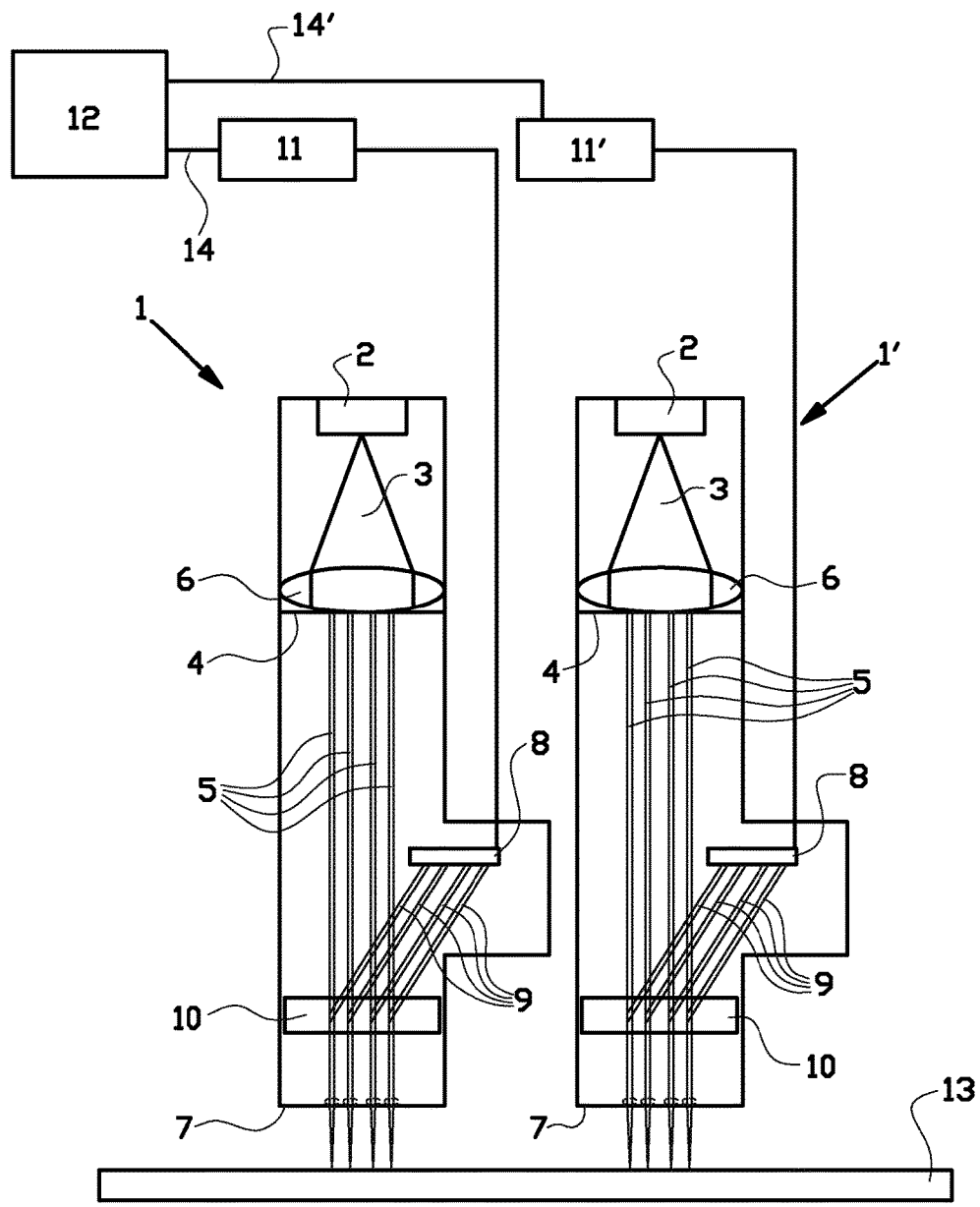
FIG. 1 schematically shows an example of an assembly of two multi-beam electron column units according to the invention.

FIG. 1 shows a schematic representation of an assembly according to the present invention. The assembly comprises two substantially identical multi-beam electron column units 1, 1'. Each unit 1, 1' comprises a single Schottky field emitter 2 for emitting a diverging electron beam 3 towards a beam splitter 4. The beam splitter 4 comprises a first multi-aperture plate comprising multiple apertures for creating multiple primary electron beams 5. The unit 1, 1' further comprises a collimator lens 6 for collimating the diverging electron beam 3 from the emitter 2, and directing the multiple primary electron beams 5 towards the objective lens unit 7 for focusing said multiple primary electron beams 5 on a sample 13. In addition, the objective lens unit 7 is arranged for picking up the secondary electrons which are formed by the interaction of the primary electrons 5 with the surface of the sample 13, and directing these secondary electrons towards a multi-sensor detection system 8. The multi-sensor detector system 8 is arranged for separately detecting the intensity of secondary electron beams 9 created by each one of said focused primary electron beams 5 on said sample 13. Furthermore each column unit 1, 1' is provided with a separator 10, such as a Wien deflector, for disentangling the (low energy) secondary electron beams 9 and the (high energy) primary electron beams 5.

As shown in FIG. 1, the collimator lens 6 is arranged before the beam splitter 4 with respect to the traveling direction of the primary electrons from the emitter 2 towards the objective lens 7. However, the collimator lens may also be arranged after the beam splitter is shown in other examples of a multi-beam electron column unit, as described below.

The two multi-beam electron column units 1, 1' are arranged adjacent to each other for inspecting different parts of the surface of the sample 13 at the same time. For illustration reasons only two multi-beam electron column units 1, 1' with 4 beams each are presented in FIG. 1. Preferably the assembly comprises 100 multi-beam electron column units of 100 electron beams each, which 100 multi-beam electron column units are arranged within the area of a 300 mm wafer. The sample 13 in this example is a single wafer as known in the semiconductor industry.

In the example of the assembly as shown in FIG. 1, each of the multi-beam electron column units 1, 1' is connected to a multi-beam electron column unit controller 11, 11'. Thus, each one of the two or more multi-beam electron column units 1, 1' comprises a single signal processing unit or controller 11, 11' which is at least connected to the multi-sensor detector system 8 of the two or more multi-beam electron column units 1, 1'. The individual multi-beam electron column unit controllers 11, 11' are connected to a central signal processing unit or assembly controller 12 assembly via a single signal line 14, 14'. In this example the multi-beam electron column unit controllers 11, 11' and the assembly controller 12 are individual controllers. In an alternative embodiment, the multi-beam electron column unit controllers 11, 11' and the assembly controller 12 may be combined in one control unit.

The multi-beam electron column unit controllers 11, 11' are arranged for controlling the functioning of the various elements of the multi-beam electron column units 1, 1' and the retrieval of data from the multi-sensor detector system 8 which contains image information of the part of the sample 13 inspected by the particular multi-beam electron column unit 1, 1'. The data from the individual multi-beam electron column units 1, 1' is combined in the assembly controller 12 to provide an image of the surface of at least substantially the whole 300 mm wafer.

Figure 2:
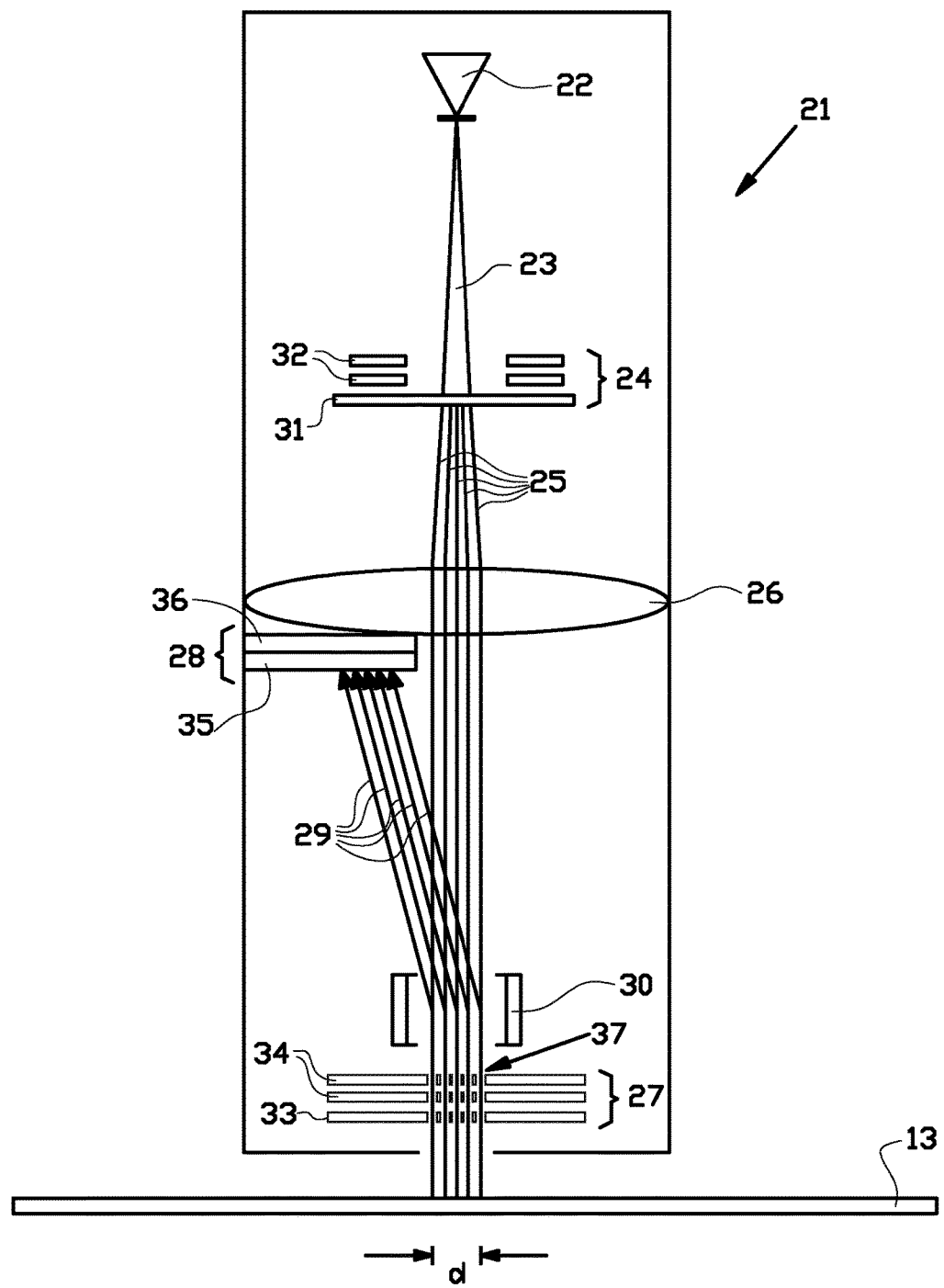
FIG. 2 schematically shows a first example of a multi-beam electron column unit for use in the assembly of FIG. 1.

A first alternative multi-beam electron column unit 21 which can be used individually or in an assembly according to the invention, is shown in FIG. 2. The multi-beam electron column unit 21 comprises a single thermal field emission source of the Schottky type 22 for emitting a diverging electron beam towards a beam splitter 24. The beam splitter 24 of this example comprises a first multi-aperture plate 31 comprising multiple apertures which are arranged for creating multiple primary electron beams 25, one primary electron beam 25 per aperture of said first multiple apertures. In addition, the beam splitter 24 comprises first electrodes 32 which together with the first multi-aperture plate 31 provides a first electrostatic lens array, wherein substantially each aperture of said first multi-aperture plate 31 in use comprises an electrostatic lens which focuses the electron beam which is created by said aperture. The electrostatic lenses of the first electrostatic lens array of the beam splitter 24 are arranged to focus the multiple primary electron beams 25 in a first focus plane.

The multi-beam electron column unit 21 further comprises a collimator lens unit 26 which collimates the diverging primary electron beams 25 coming from the beam splitter 24, into a array of substantially parallel primary electron beams 25. Although not explicit from FIG. 2, but clearly depicted in FIGS. 5A and 7, the first focus plane is arranged in or near the collimator lens unit 26, in order to limit or even circumvent, optical aberrations in the primary electron beams 25, which may be induced by the collimator lens unit 26. From the collimator lens unit 26, the collimated primary electron beams 25 are directed to the objective lens unit 27 for focusing said multiple primary electron beams 25 on said sample 13. On its way toward the objective lens unit 27, the primary electron beams 25 pass through a Wien deflector 30 which, in use, is arranged with a field strength which has a negligible influence on the high energy primary electron beams 25.

The objective lens unit 27 comprises a second electrostatic lens array for focusing said multiple primary electron beams on the surface of the sample, wherein the second electrostatic lens array comprises at least a second multi-aperture plate 33. In addition the objective lens unit comprises second electrodes 34 which together with the second multi-aperture plate 33 provide the second electrostatic lens array. In use, at least one of said second electrodes 34 is set at a different voltage from the second multi-aperture plate 33 such that each aperture of said second multi-aperture plate 33 in use comprises an electrostatic lens which focuses the primary electron beams 25 onto the surface of the sample 13. In this example, the second electrodes 34 are arranged at a distance from the second multi-aperture plate 33, and each one of said second electrodes 34 comprises a multi-aperture plate having an array of apertures 37 which are aligned with the apertures of the second multi-aperture plate 33. The apertures are aligned in order to provide passage of on the multiple primary electron beams 25 through one aperture 37 of each one of the multi-aperture plates of the second electrodes 34 and one associated aperture of the second multi-aperture plate 33.

Alternatively, the objective lens unit comprises second electrodes, which each comprises a single hole for passing said multiple primary electron beams there through. Such an objective lens unit is described in more detail below with reference to FIG. 9.

In use, said second multi-aperture plate 33 is set at a different voltage with respect to the surface of the sample 13 in order to provide an electrostatic deceleration field for the primary electron beams 25, which electrostatic deceleration field is arranged between the second multi-aperture plate 33 and the surface of the sample 13. In addition, a further electrostatic deceleration field is in use arranged between the nearest electrode at a side of said multi-aperture plate 33 facing away from the sample 13. In this example the nearest electrode is one of the second electrodes 34. Furthermore, the further electrostatic deceleration field between the second electrode 34 and the second multi-aperture plate 33 is preferably arranged to be larger than the electrostatic deceleration field between the second multi-aperture plate 33 and the surface of the sample 13. This deceleration field for the primary electron beams provides an acceleration field for the secondary electrons 29 from the sample 13, which acceleration field is used to direct the secondary electrons 29 upwards in a direction opposite to the traveling direction of the primary electrons 25.

On its way away from objective lens unit 27, the secondary electron beams 29 pass through the Wien deflector 30 which, in use, is arranged with a field strength which deflect the low energy secondary electron beams 29 over a small angle between 1 and 20 degrees, preferably over an angle of 3 degrees, which is sufficient to disentangle the secondary electron beams 29 from the primary electron beams 25, in particular without substantially deflecting the primary electron beams 25, as depicted schematically in FIG. 2. The Wien deflector 30 is provided with an electrostatic deflector which in use generates an electrostatic field which is arranged to compensate the influence of the magnetic field on the high energy primary electrons 25. An example of such an electrostatic deflector is for example shown in FIG. 6A (reference numbers 882, 883) and FIG. 6B (reference number 893), which examples are discussed in more detail below, with reference to these figures.

The deflected secondary electron beams 29 are directed towards the multi-sensor detector system 28. The multi-sensor detector system 28 of this example comprises a fluorescent plate 35, which is arranged so that the fluorescent plate 35 does not interfere with the trajectory of the primary electron beams 25. In the example of FIG. 2 this is established by arranging the fluorescent plate 35 next to the trajectory of the primary electron beams 25.

The fluorescent plate 35 is arranged at a position for separately detecting the intensity of the individual secondary electron beams 29 created by each one of said focused primary electron beams 25 on said sample 13. In particular, the fluorescent plate 35 is arranged for receiving the secondary electron beams 29 and for generating a light emitting spot for each one of said secondary electron beams 29.

As shown in FIG. 2, a multi-sensor detector 36 is arranged at a side of the fluorescent plate 35 which faces away from the objective lens unit 27. The multi-sensor detector 36 comprises a multi-pixel light detector, in particular one of a CCD camera, a CMOS camera, an array of photo diodes, and an array of photo multipliers. In this example, the separation of the secondary electron beams 29 at the fluorescent plate 35 is arranged such that, in use, the multi-sensor detector 36 separately detects the intensity of the individual secondary electron beams 29 created by each one of said focused primary electron beams 25 on said sample 13.

In practical example, the multi-beam electron column unit 21 is arranged for using 100 primary electron beams 25 which are arranged in a regular array in which the pitch of said focused primary electron beams 25 on the surface of the sample 13 is in a range from 50 to 500 micron, in particular 150 micron. The regular array comprises for example 10×10 primary electron beams 25. In this case, the diameter d of the array of primary electron beams 25 on the surface of the sample 13 is in a range from approximately 0.5-5 mm, in particular from 1 to 2 mm.

Figure 6A:
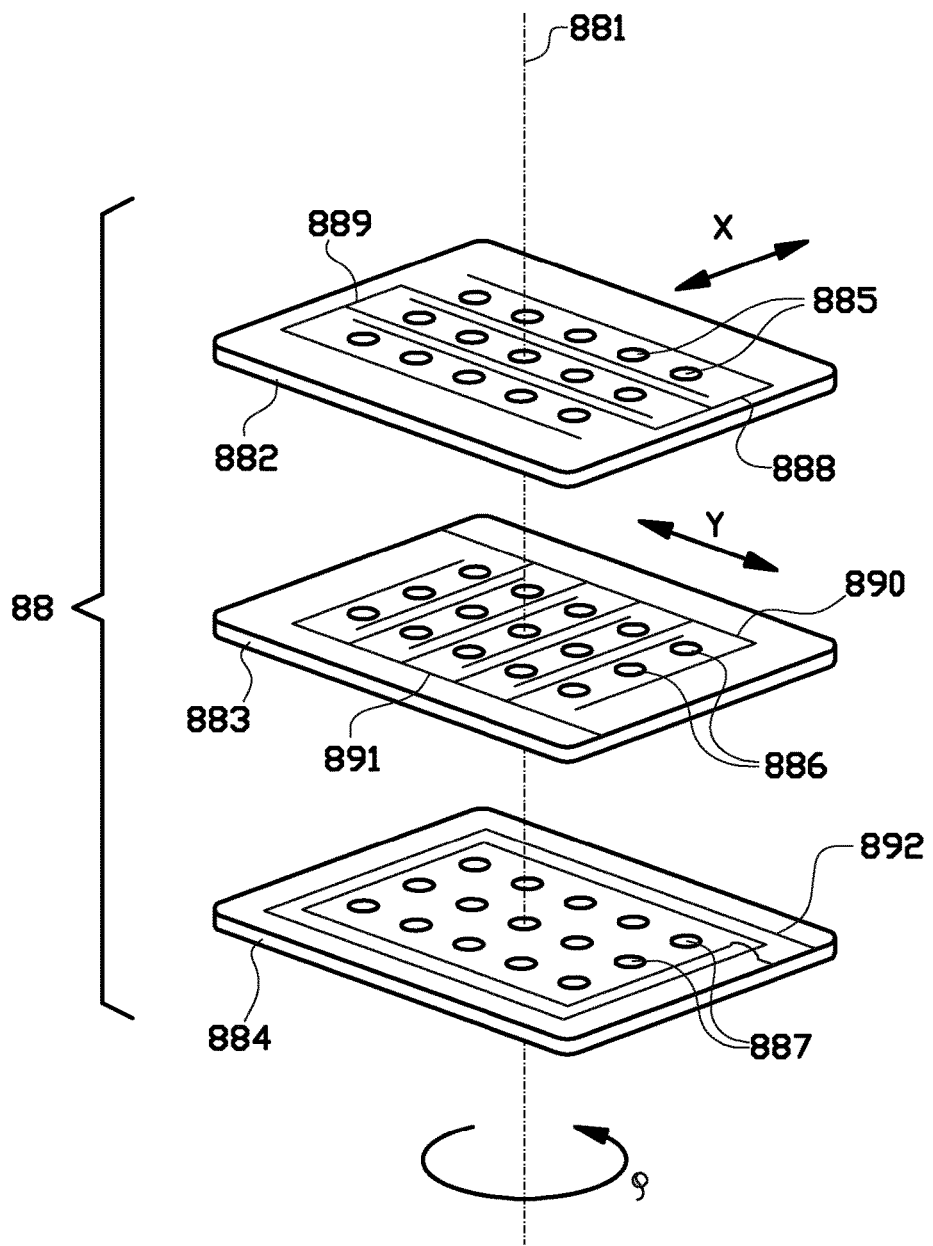
FIGS. 6A, 6B and 6C schematically shows three examples of a deflector subsystem.
Figure 6C:
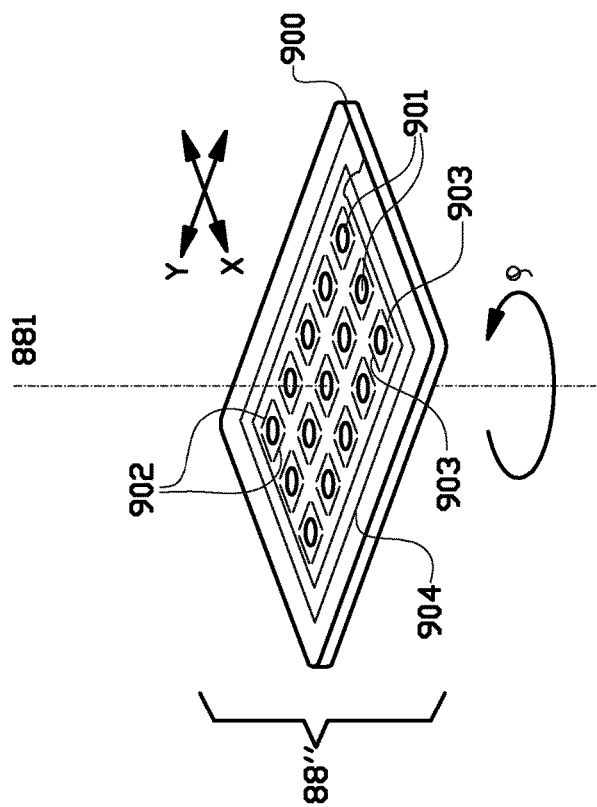
Figure 6B:
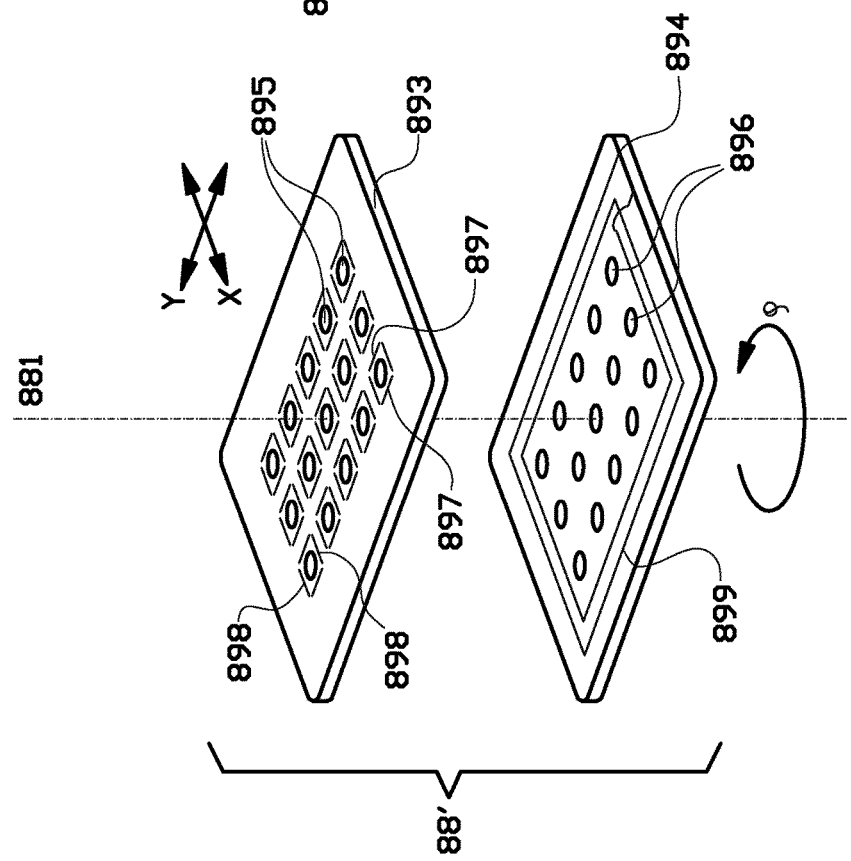

In order to cover the area in between the regularly arranged array of primary electron beams 25, the objective lens unit 27 is provided by a scanning deflector for scanning the array of primary electron beams 25 over de surface of the sample 13. The scanning deflector is not shown in detail in FIG. 2, but an example of such a scanning deflector is shown in FIGS. 6A, 6B and 6C, which are discussed in more detail below.

Figure 3:
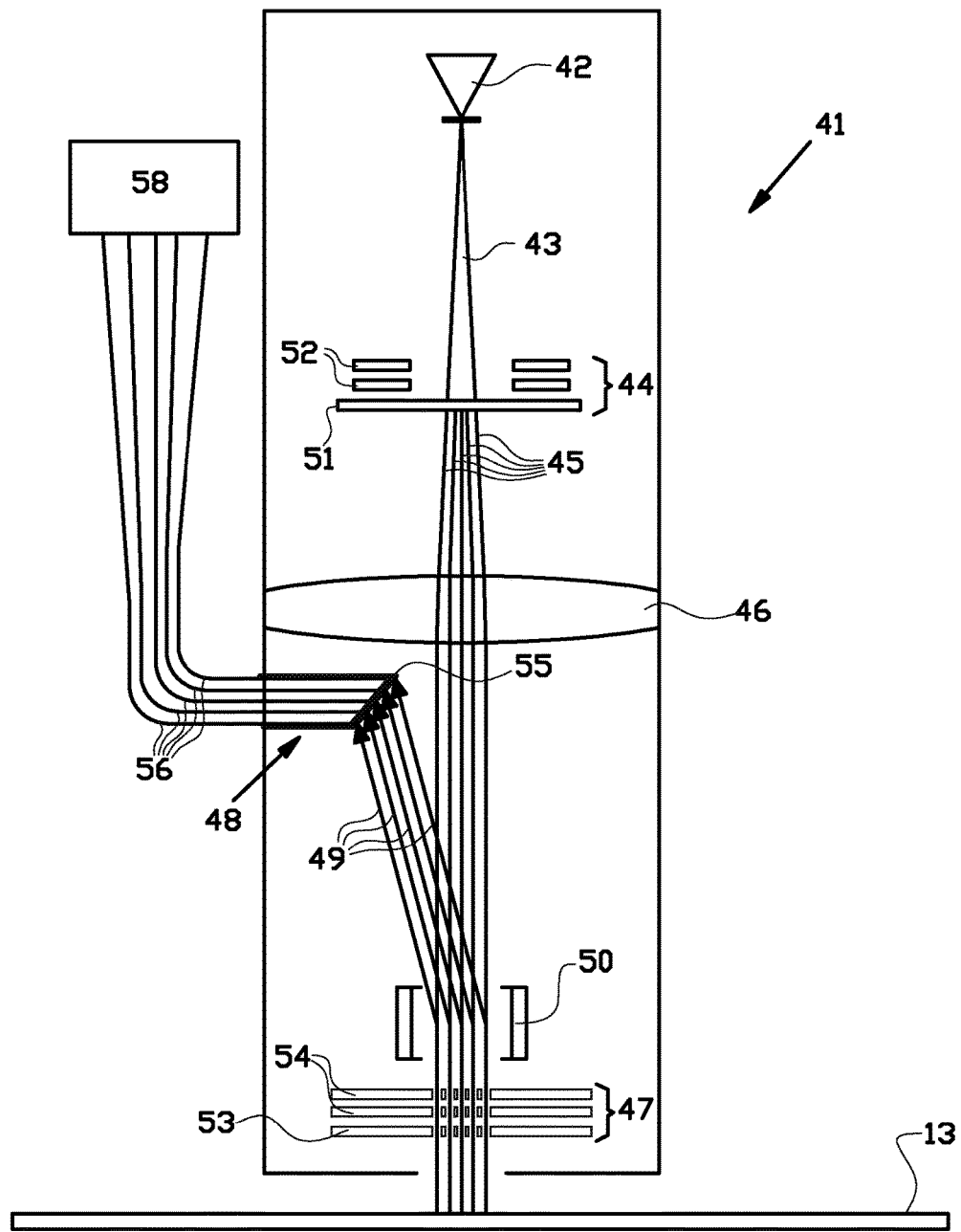
FIG. 3 schematically shows a second example of a multi-beam electron column unit for use in the assembly of FIG. 1.

A second alternative multi-beam electron column unit 41 which can be used individually or in an assembly according to the invention, is shown in FIG. 3. Again, the multi-beam electron column unit 41 comprises a single thermal field emission source 42 for emitting a diverging electron beam towards a beam splitter 44. The beam splitter 44 comprises a first multi-aperture plate 51 comprising multiple apertures which are arranged for creating multiple primary electron beams 45. In addition, the beam splitter 44 comprises first electrodes 52 which together with the first multi-aperture plate 51 provides a first electrostatic lens array, wherein substantially each aperture of said first multi-aperture plate 51 in use comprises an electrostatic lens which focuses the primary electron beam 45 which is created by said aperture. Again, the electrostatic lenses of the first electrostatic lens array of the beam splitter 44 are arranged to focus the multiple primary electron beams 45 in a first focus plane which is arranged in or near a collimator lens unit 46. The collimator lens unit 46 collimates the diverging primary electron beams 45 coming from the beam splitter 44, into an array of substantially parallel primary electron beams 45. From the collimator lens unit 46, the collimated primary electron beams 45 are directed to the objective lens unit 47 for focusing said multiple primary electron beams 45 on a sample 13. On its way toward the objective lens unit 47, the primary electron beams 45 pass through a Wien deflector 50 which, in use, is arranged with a field strength which has a negligible influence on the high energy primary electron beams 45. The Wien deflector 50 is provided with an electrostatic deflector which in use generates an electrostatic field which is arranged to compensate the influence of the magnetic field on the high energy primary electrons 45. The objective lens unit 47 comprises a second electrostatic lens array for focusing said multiple primary electron beams 45 on the surface of the sample 13, wherein the second electrostatic lens array comprises at least a second multi-aperture plate 53 and secondary electrodes 54 which together provide the second electrostatic lens array. Again, the objective lens unit 47 is in use arranged to provide an acceleration field for the secondary electrons 49 from the sample 13, which acceleration field is used to direct the secondary electrons 49 upwards in a direction opposite to the traveling direction of the primary electrons 45. On its way away from objective lens unit 47, the secondary electron beams 49 pass through the Wien deflector 50 which, in use, is arranged with a field strength which deflect the low energy secondary electron beams 49 over a small angle, which is sufficient to disentangle the secondary electron beams 49 from the primary electron beams 45, as depicted schematically in FIG. 3. The deflected secondary electron beams 49 are directed towards the multi-sensor detector system 48.

As shown in FIG. 3, this second alternative multi-beam electron column unit 41 comprises a multi-sensor detector system 48 which differs from the multi-sensor detector system 28 of the previous example. The multi-sensor detector system 48 of this second alternative multi-beam electron column unit 41 comprises an array of optical fibers 56, which are arranged in a bundle having a first end which is arranged next to the trajectory of the primary electron beams 45, in particular so that the first end does not interfere with the trajectory of the primary electron beams 45. Adjacent or attached to said first end is a fluorescent plate or layer 55 which is arranged for receiving the secondary electron beams 49 and for generating a substantially separate light emitting spot for each one of said secondary electron beams 49.

In this example, the separation of the secondary electron beams 49 at the fluorescent plate 55 is arranged such that, in use, one or more of said optical fibers 56 is associated with each one of said light emitting spots. At least part of the light from one of said light emitting spots is coupled into the one or more optical fibers 56 associated with said one of said light emitting spots, and is conveyed by the optical fibers 56 to a multi-sensor detector 58, which is arranged at a second end, opposite to said first end, of said bundle of optical fibers 56. The multi-sensor detector 58 comprises a multi-pixel light detector, in particular one of a CCD camera, a CMOS camera, an array of photo diodes, and an array of photo multipliers.

An advantage of this construction is, that the multi-sensor detector 58 can be arranged at a distance of said fluorescent plate 55, or even separate from the multi-beam electron column unit 41 in order to provide a smaller footprint for the multi-beam electron column unit 41, for example.

A further advantage of this construction is, that the bundle of optical fibers 56 may be arranged to spread out in order to cover a larger area at the second end with respect to the first end of the bundle, as schematically depicted in FIG. 3. Due to this larger area at the second end of the bundle of optical fibers 56, which is arranged at or coupled to the multi-sensor detector 58, the light from the separate light emitting spots on the fluorescent plate 55 are separated more at the multi-sensor detector 58, making it more easy to separately detect the light from the individual spots. It is also possible to split the bundle of optical fibers 56 into sub-bundles, wherein each sub-bundle is connected to an individual detector. The spreading out or splitting of the optical fibers 56 allows more space for the individual detectors of the multi-sensor detector 58.

Figure 4:
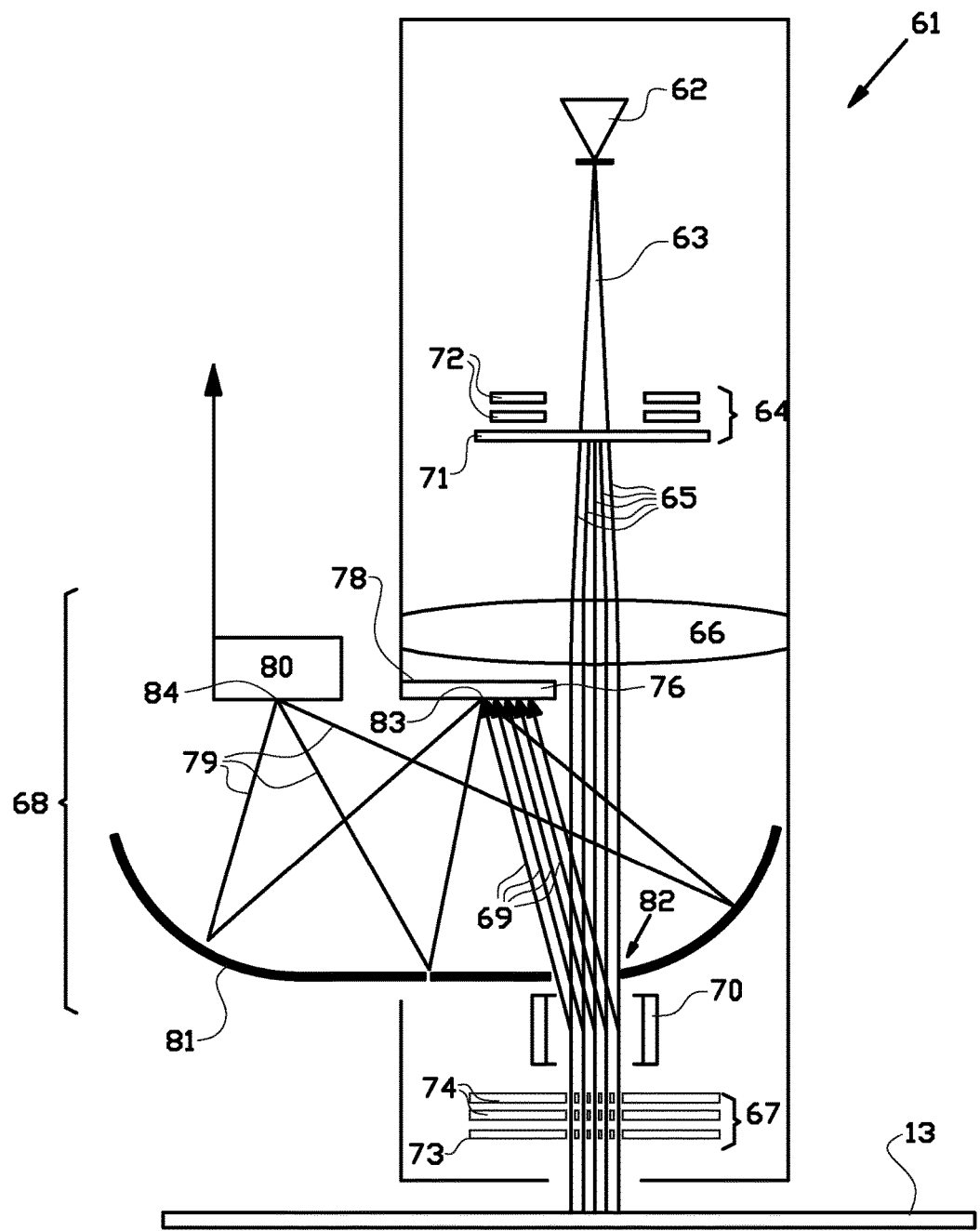
FIG. 4 schematically shows a third example of a multi-beam electron column unit for use in the assembly of FIG. 1.

A third alternative multi-beam electron column unit 61 which can be used individually or in an assembly according to the invention, is shown in FIG. 4. Again, the multi-beam electron column unit 61 comprises a single thermal field emission source 62 for emitting a diverging electron beam towards a beam splitter 64. The beam splitter comprises a first multi-aperture plate 71 comprising multiple apertures which are arranged for creating multiple primary electron beams 65. In addition, the beam splitter 64 comprises first electrodes 72 which together with the first multi-aperture plate 71 provides a first electrostatic lens array, wherein substantially each aperture of said first multi-aperture plate 71 in use comprises an electrostatic lens which focuses the primary electron beam 65 which is created by said aperture. Again, the electrostatic lenses of the first electrostatic lens array of the beam splitter 64 are arranged to focus the multiple primary electron beams 65 in a first focus plane which is arranged in or near a collimator lens unit 66. The collimator lens unit 66 collimates the diverging primary electron beams 65 coming from the beam splitter 64, into an array of substantially parallel primary electron beams 65. From the collimator lens unit 66, the collimated primary electron beams 65 are directed to the objective lens unit 67 for focusing said multiple primary electron beams 65 on a sample 13. On its way toward the objective lens unit 67, the primary electron beams 45 pass through a Wien deflector 70 which, in use, is arranged with a field strength which has a negligible influence on the high energy primary electron beams 65. The Wien deflector 70 is provided with an electrostatic deflector which in use generates an electrostatic field which is arranged to compensate the influence of the magnetic field on the high energy primary electrons 75. The objective lens unit 67 comprises a second electrostatic lens array for focusing said multiple primary electron beams 65 on the surface of the sample 13, wherein the second electrostatic lens array comprises at least a second multi-aperture plate 73 and secondary electrodes 74 which together provide the second electrostatic lens array. Again, the objective lens unit 67 is in use arranged to provide an acceleration field for the secondary electrons 69 from the sample 13, which acceleration field is used to direct the secondary electrons 69 upwards in a direction opposite to the traveling direction of the primary electrons 65. On its way away from objective lens unit 67, the secondary electron beams 69 pass through the Wien deflector 70 which, in use, is arranged with a field strength which deflect the low energy secondary electron beams 69 over a small angle, which is sufficient to disentangle the secondary electron beams 69 from the primary electron beams 65, as depicted schematically in FIG. 4. The deflected secondary electron beams 69 are directed towards the multi-sensor detector system 68.

As shown in FIG. 4, this third alternative multi-beam electron column unit 61 comprises a multi-sensor detector system 68 which differs from the multi-sensor detector system 28, 48 of the previous examples. The multi-sensor detector system 68 of this example comprises a fluorescent plate 75, which is arranged next to the trajectory of the primary electron beams 65, so that the fluorescent plate 75 does not interfere with the trajectory of the primary electron beams 65. Again, the fluorescent plate 75 is arranged for receiving the secondary electron beams 69 and for generating a light emitting spot for each one of said secondary electron beams 69.

The multi-sensor detector system 68 of this example further comprises a mirror 81 for imaging the light emitting spots of said fluorescent plate 75 onto a multi-sensor detector 80. FIG. 4 schematically shows several light rays 79 to indicate the imaging of one of said light emitting spots 83 on a spot 84 on said multi-sensor detector 80. As depicted in FIG. 4, the mirror 81 of this example is provided with a through opening 82 at the position of the trajectory of the primary electron beams 65 and the secondary electron beams 69. Preferably the mirror 81 comprises a substantially ellipse shaped reflecting surface.

An advantage of this construction is, that the ellipse shaped mirror 81 has a high light-gathering power or large numerical aperture, which enables to project a large part of the generated light 79 by a secondary electron beam from the fluorescent plate 76 onto the multi-sensor detector 80. The multi-sensor detector 80 comprises a multi-pixel light detector, in particular one of a CCD camera, a CMOS camera, an array of photo diodes, and an array of photo multipliers.

In is noted, that the light-gathering power can even be increased further by providing the fluorescent plate 76 with a mirror surface 78 at a side of said fluorescent plate 76 facing away from the objective lens unit 67.

It is further noted, that the fluorescent plate 76 can also be imaged onto the multi-sensor detector 80 using a lens system, as for example disclosed in WO 2006/009444.

The various examples of the multi-beam electron column units 1, 1', 21, 41, 61 as described above and shown in FIGS. 1 to 4, use substantially the same components for projecting the primary electrons from the single thermal field emission source 2, 22, 42, 62 onto the surface of a sample 13. Additional and/or alternative components for the multi-beam electron column units are presented below with reference to FIGS. 5 to 10. It is noted that these additional and/or alternative components can be used in an assembly according to the invention, but also individually in other electron-optical arrangements.

Figure 5A:
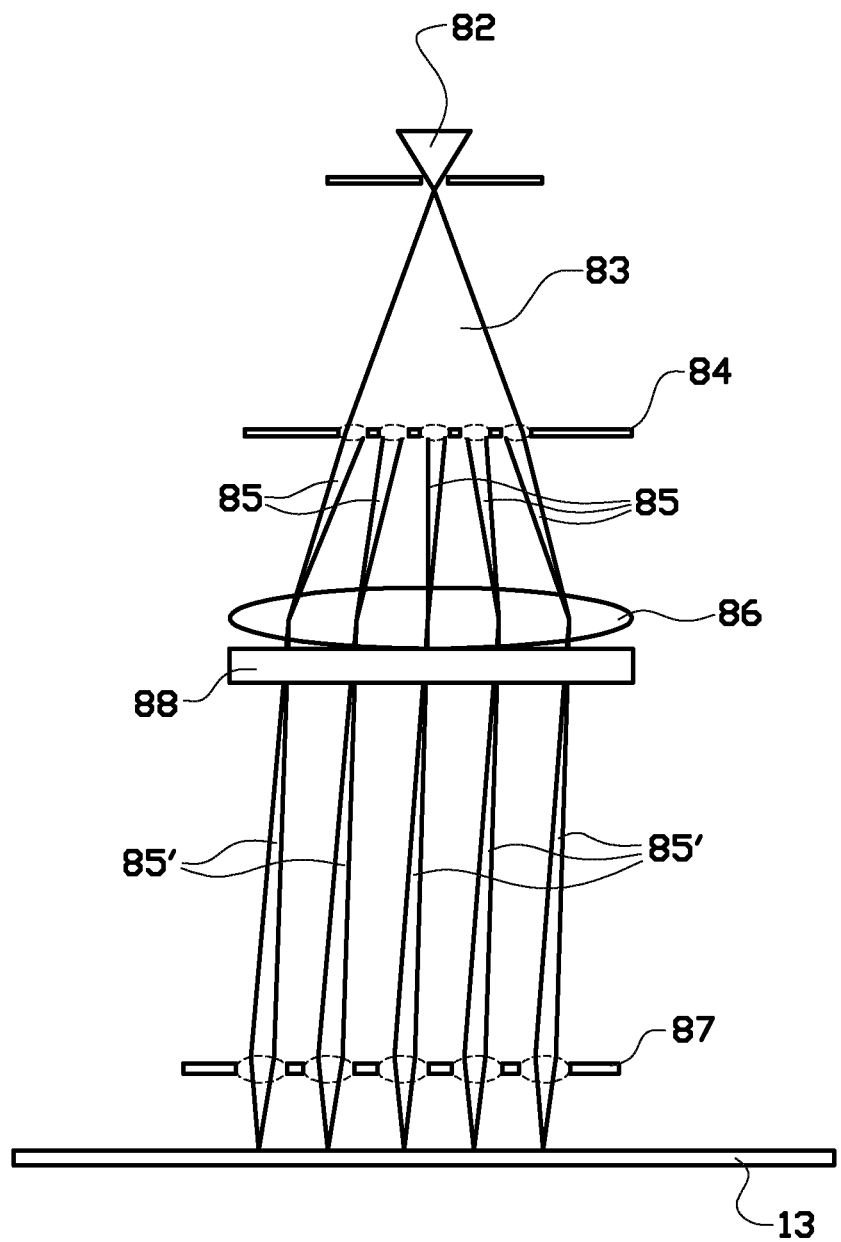
FIG. 5A schematically shows an example of electron-optical components for the primary electron beams comprising a deflector subsystem for use in any one of the examples shown in FIGS. 2, 3 and 4.
Figure 5B:
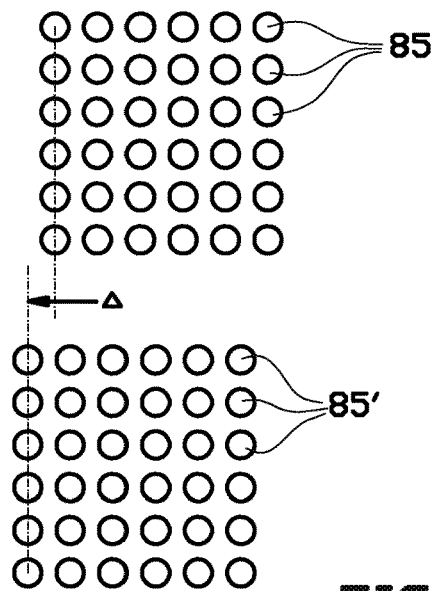
FIGS. 5B and 5C schematically shows a possible deflection of the primary electron beams by the deflector subsystem.
Figure 5C:
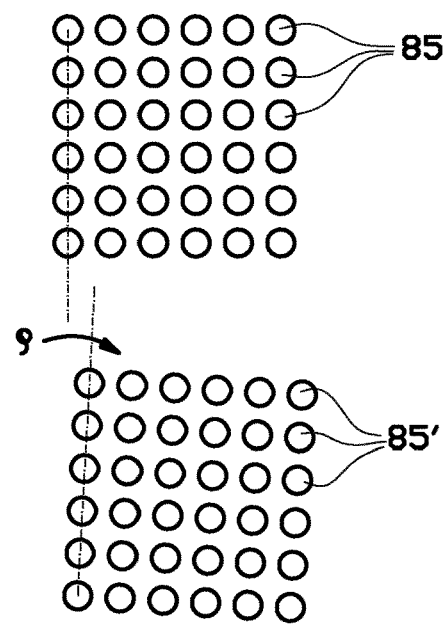

In a first additional component comprises a deflector subsystem as shown in FIG. 5A. The components for projecting the primary electrons 83 from a single emission source 82 onto a sample 13, comprises a beam splitter 84 arranged for creating multiple primary electron beams 85, a collimator lens 86, an objective lens unit 87, and, in addition, a deflector subsystem or deflection unit 88 for aligning the multiple primary electron beams 85 from said beam splitter 84 onto the centers of the lenses in the objective lens unit 87, in particular the lenses of the second electrostatic lens array. Preferably the deflector unit 88 is arranged for deflecting the complete array of primary electron beams 85 over a distance Δ as schematically shown in FIG. 5B, and/or for rotating of the complete array of primary electron beams 85 over an angle φ as schematically shown in FIG. 5C.

FIG. 6A shows an exploded view of a first example of such a deflector unit 88. The unit 88 comprises three substrates 882, 883, 884, each comprising an array of through openings 885, 886, 887. The array of through openings 885, 886, 887 of the three substrates are arranged in line in a direction parallel to an optical axis 881, such that each primary electron beam traverses a set of aligned through openings, one through opening of each of said three substrates 882, 883, 884. The three substrates 882, 883, 884 are arranged to extend in a plane substantially perpendicular to the optical axis 881.

The first substrate 882 is provided with first electrodes 888 and second electrodes 889, which first and second electrodes extend in a direction substantially parallel to an y-direction and are arranged at both sides of said through openings 885, a first electrode 888 adjacent said through openings 885 on one side and a second electrode 889 adjacent said through openings 885 on the other side opposite said one side. By providing a different voltage to the first and second electrodes an electrostatic field is generated for deflecting the complete array of primary electron beams 85 in an x-direction.

The second substrate 883 is provided with first electrodes 890 and second electrodes 891, which first and second electrodes extend in a direction substantially parallel to the x-direction and are arranged at both sides of said through openings 886, a first electrode 890 adjacent said through openings 886 on one side and a second electrode 891 adjacent said through openings 886 on the other side opposite said one side. By providing a different voltage to the first and second electrodes an electrostatic field is generated for deflecting the complete array of primary electron beams 85 in the y-direction.

The third substrate 884 is provided with a strip of electrically conducting material which is arranged around the array of through openings 887 as a coil 892. By providing a current to run through said coil 892, a magnetic field is generated for rotating the complete array of primary electron beams 85 around the optical axis 881.

The first example of a deflector unit 88, as shown in FIG. 6A, provides a common action on all primary electron beams 85 for aligning said complete array of primary electron beams 85' onto the corresponding lenses of the objective lens unit 87. It is noted that similar defection unit comprising said first substrate 882 and/or said second substrate 883 can be used at or in said objective lens unit 87 for scanning the primary electron beams 85' over the surface of the sample 13, and at or in said Wien deflector to compensate for the influence of the magnetic field on the high energy primary electrons.

FIG. 6B shows an exploded view of a second example of such a deflector unit 88'. The unit 88' comprises two substrates 893, 894, each comprising an array of through openings 895, 896. The array of through openings 895, 896 of the three substrates are arranged in line in a direction parallel to an optical axis 881, such at each primary electron beam traverses a set of aligned through openings, one through opening of each of said two substrates 893, 894. The two substrates 893, 894 are arranged to extend in a plane substantially perpendicular to the optical axis 881.

Each through opening 895 of the first substrate 893 is provided with first electrodes 897 and second electrodes 898 arranged adjacent said through opening 895. By providing a potential difference to the first electrodes 897 of one of said through openings 895 an electrostatic field is generated for deflecting a primary electron beam which traverses through said one of said through openings 895 in an x-direction. By providing a potential difference to the second electrodes 898 of one of said through openings 895 an electrostatic field is generated for deflecting a primary electron beam which traverses through said one of said through openings 895 in an y-direction.

The second substrate 894 is provided with a strip of electrically conducting material which is arranged around the array of through openings 896 as a coil 899. By providing a current to run through said coil 899, a magnetic field is generated for rotating the complete array of primary electron beams 85 around the optical axis 881.

In an embodiment, first substrate 893 or a driver therefore is arranged for providing the same first potential difference to the first electrodes 897 of each one of said through openings 895, and/or for providing the same second potential difference to the second electrodes 897 of each one of said through openings 895. Providing such a same first potential difference to the first electrodes 897 and/or a same second potential difference to the second electrodes 898, provides a common action on all primary electron beams 85 for aligning said complete array of primary electron beams 85' onto the corresponding lenses of the objective lens unit 87.

In an alternative embodiment, the first substrate or a driver therefore is arranged for adjusting the potential difference for the first electrodes 897 and the potential difference for the second electrodes 898 for each through opening 895 individually. This allows adjusting the deflection of each primary electron beam 85 in the x-direction and/or y-direction individually to its corresponding objective lens of the array of objective lenses in the objective lens unit 87. It is noted that the rotational alignment φ of this alternative embodiment is still a common action for all primary electron beams 85.

FIG. 6C shows an exploded view of a third example of such a deflector unit 88". The unit 88" comprises only one substrate 900, comprising an array of through openings 901. The substrate 900 is arranged to extend in a plane substantially perpendicular to the optical axis 881.

Each through opening 901 of the substrate 900 is provided with first electrodes 902 and second electrodes 903 arranged adjacent said through opening 901. By providing a potential difference to the first electrodes 902 of one of said through openings 901 an electrostatic field is generated for deflecting a primary electron beam 85 which traverses through said one of said through openings 901 in an x-direction. By providing a potential difference to the second electrodes 903 of one of said through openings 901 an electrostatic field is generated for deflecting a primary electron beam 85 which traverses through said one of said through openings 901 in an y-direction. In addition, the substrate 900 is provided with a strip of electrically conducting material which is arranged around the array of through openings 901 as a coil 904. By providing a current to run through said coil 904, a magnetic field is generated for rotating the complete array of primary electron beams 85 around the optical axis 881. By arranging the first electrodes 902, the second electrode 903 and the coil 904 on a single substrate 900, a very compact deflector unit 88" is obtained which highly suitable for use in compact multi-beam electron column units in general, in particular for an assembly according to the invention.

In an embodiment, substrate 900 or a driver therefore is arranged for providing the same first potential difference to the first electrodes 902 of each one of said through openings 901, and/or for providing the same second potential difference to the second electrodes 903 of each one of said through openings 901. Providing such a same first potential difference to the first electrodes 902 and/or a same second potential difference to the second electrodes 903, provides a common action on all primary electron beams 85 for aligning said complete array of primary electron beams 85' onto the corresponding lenses of the objective lens unit 87.

In an alternative embodiment, the substrate 900 or a driver therefore is arranged for adjusting the potential difference for the first electrodes 902 and the potential difference for the second electrodes 903 for each through opening 901 individually. This allows adjusting the deflection of each primary electron beam 85 in the x-direction and/or y-direction individually to its corresponding objective lens of the array of objective lenses in the objective lens unit 87. It is noted that the rotational alignment φ of this alternative embodiment is still a common action for all primary electron beams 85.

It is noted, that in case the collimator lens 86 is a magnetic collimator lens, the collimator lens can also be used for the rotational alignment φ of the array of primary electron beams 85, instead of or in addition to the coil 892, 899, 904 of the deflection unit 88, 88', 88".

Figure 6D:
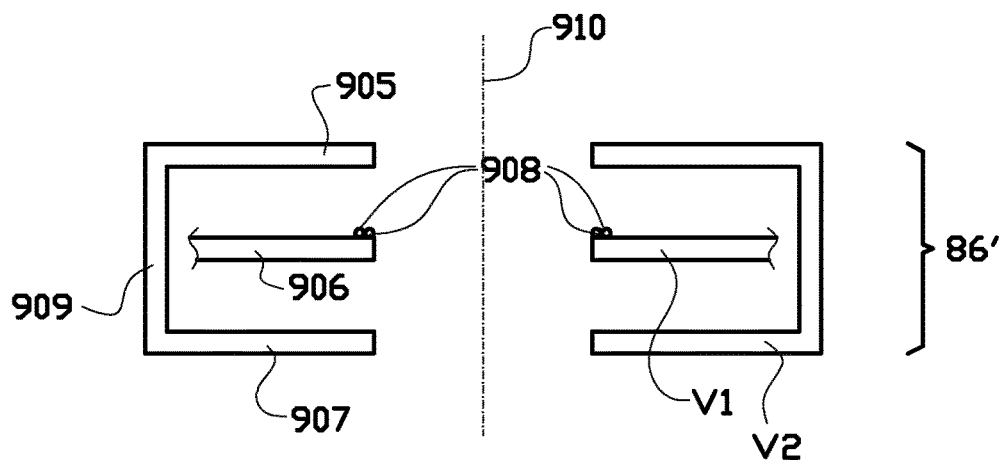
FIG. 6D schematically shows an example of a collimator lens design for collimating and rotating the array of primary charged particle beams.

It is further noted, that in case the collimator lens 86' is an electrostatic collimator lens 86, as shown in the schematic cross-section in FIG. 6D, this collimator lens 86' can be provided with a coil 908. The collimator 86' of this example comprises a central electrode 906, and two secondary electrodes 905, 907 arranged on both sides of the central electrode 906 and at a distance from the central electrode 906, in particular in a direction parallel to the optical axis 910. By providing, in use, a different voltage V1 to the central electrode 906 with respect to a voltage V2 of the secondary electrodes 905, 907, an electrostatic field is generated which provides a lens effect to the traversing electron beams.

As depicted in FIG. 6D, the coil 908 is arranged on or attached to the central electrode 906. By providing a current to run through said coil 908, a magnetic field is generated for rotating the electron beams which pass through said collimator 86' around the optical axis 910. In addition, the secondary electrodes 905, 907 at least partially comprises a layer of ferromagnetic material, wherein the ferromagnetic material of the secondary electrodes 905, 907 are interconnected by a bridging ferromagnetic interconnect 909 which provides a magnetic circuit for the magnetic field lines of the magnetic field which in use is generated by the coil 908, which magnetic field lines are in the form of closed loops. In an example, the ferromagnetic material comprises iron. According to this example, the secondary electrodes 905, 907 with the interconnect 909 of ferromagnetic material provides the electrostatic collimator 86' with a well-defined magnetic field which can be used for adjusting the pitch and/or rotation φ of the array of primary electron beams 85.

Figure 7:
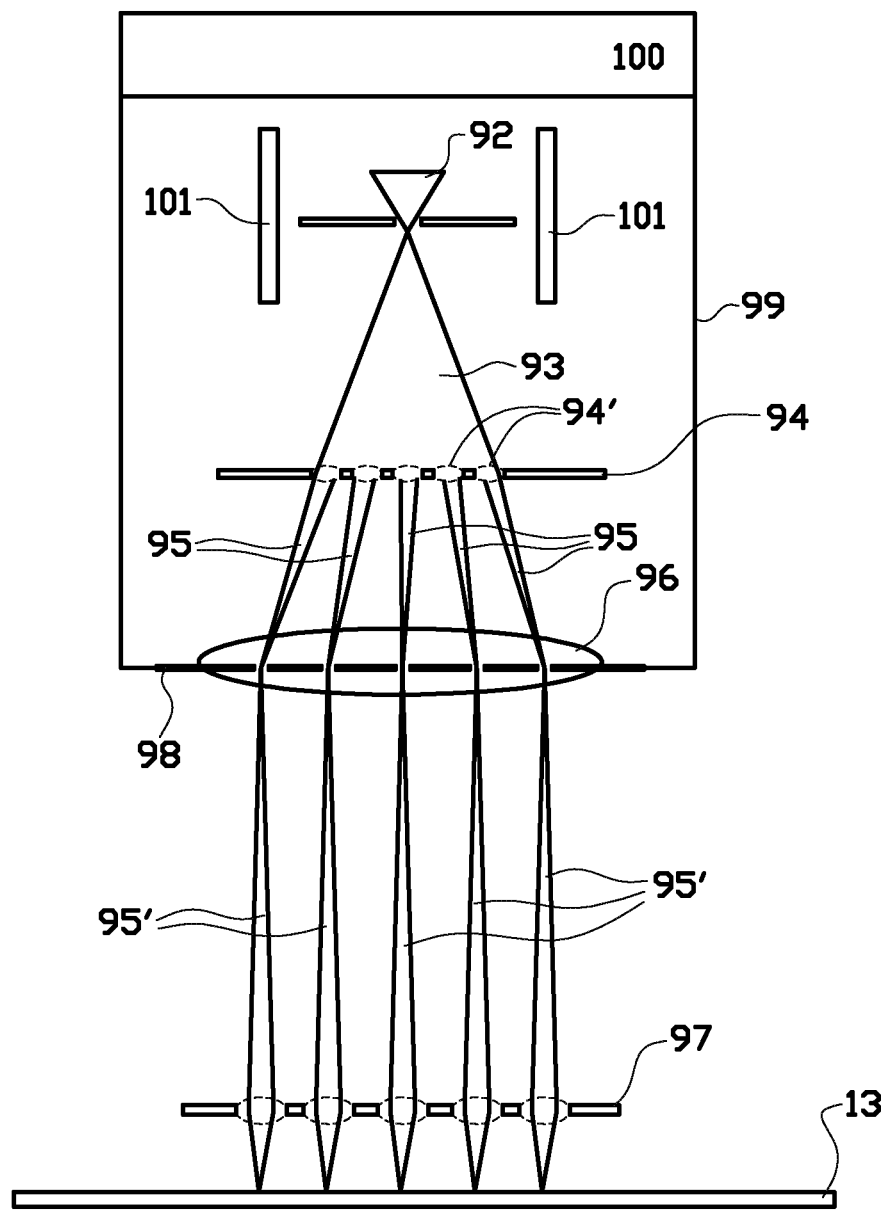
FIG. 7 schematically shows an example of electron-optical components for the primary electron beams comprising an enclosure for the electron source for use in any one of the examples shown in FIGS. 2, 3 and 4.
Figure 8:
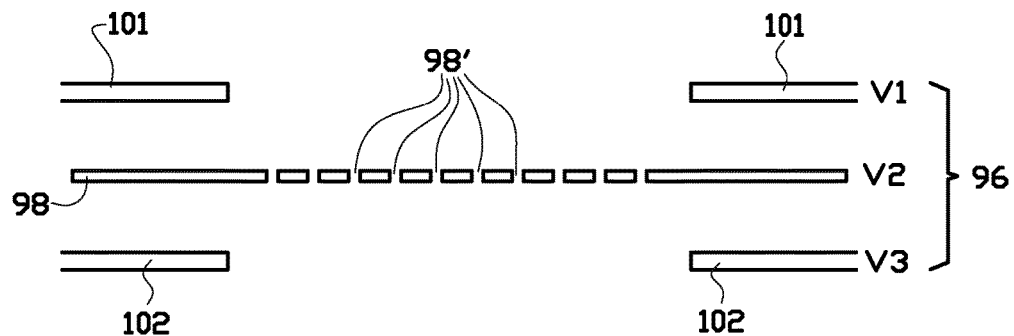
FIG. 8 schematically shows an example of a collimator lens comprising an aperture array for use in the example of FIG. 7.

A second additional component comprises a chamber for substantially enclosing the single thermal field emission source 92, as shown in FIG. 7. The components for projecting the primary electrons 93 from the single emission source 92 onto a sample 13, comprises a beam splitter 94 arranged for creating multiple primary electron beams 95, a collimator lens 96, and an objective lens unit 97. The beam splitter 94 comprises a first electrostatic lens array, wherein each aperture of said beam splitter 94 in use comprises an electrostatic lens 94', and wherein the electrostatic lenses 94' are arranged to focus each individual primary electron beam 95 in a first focus plane. At the first focus plane, a third multi-aperture plate 98 is arranged, which third multi-aperture plate 98 comprises multiple apertures which are arranged for passing the focused primary electron beams 95 there through. Because the primary electron beams 95 are focused at or near the third multi-aperture plate 98, the apertures can be very small without obstructing the primary electron beams 95. Typical the diameter of said apertures can be as small as 5 micron.

This third multi-aperture plate 98 is arranged as a wall of the chamber 99 for enclosing the single thermal field emission source 92, wherein the apertures in said wall allow the primary electron beams 95 to pass through. All other walls of the chamber 99 are substantially closed to separate the thermal field emission source 92 from the environment outside said chamber 99, in which some parts of the multi-beam electron column unit, in particular said objective lens unit 97, and the sample 13 is arranged. The small apertures of the third multi-aperture plate 98 only provides a very limited leakage into the chamber 99, which allows to provide a much lower vacuum pressure inside the vacuum chamber 99 comprising the thermal field emission source 92, with respect to the environment outside the chamber 99, in particular the vacuum pressure of the vacuum environment outside the chamber 99. For example, a suitable vacuum pressure inside the chamber 99 for operating the thermal field emission source 92, preferably of the Schottky type, is approximately $10^{-9}$ torr, whereas a vacuum pressure of the vacuum environment outside the chamber 99 may for example be only $10^{-5}$ torr, which is sufficient for projecting the primary electron beams 95' onto the surface of the sample 13, and for collecting and detecting the secondary electrons from the surface of the sample 13.

In order to obtain the lower vacuum pressure inside the vacuum chamber 99, the chamber 99 may be connected to a vacuum pump, for example via a vacuum pipe. However, in the example as shown in FIG. 7, a vacuum pump 100 is coupled directly to the chamber 99, in particular the vacuum pump 100 is part of the chamber 99. As shown in FIG. 7, the vacuum pump 100 is arranged at a side of the chamber 99 close to the thermal field emission source 92, preferably at a side of said chamber 99 opposite to the third multi-aperture plate 98. In the example shown in FIG. 7, the third multi-aperture plate 98 is arranged on the bottom or is part of the bottom wall of the chamber 99, whereas the vacuum pump 100 is arranged at the top or is part of the top wall of the chamber 99.

Preferably the vacuum pump 100 is a ion pump or a getter pump. In contrast to other vacuum pumps, such as turbomolecular pumps and diffusion pumps, ion pumps or getter pumps have no moving parts and use no oil. They are therefore clean, need little maintenance, and produce no vibrations, which makes them highly suitable for incorporation in a multi-beam electron column unit. Preferably each one of the multi-beam electron units in the assembly according to the invention is provided with its own vacuum pump 100.

In the example as shown in FIG. 7, the multi-beam electron column unit comprises a deflector 101 at or near the single thermal field emission source 92. The deflector 101 is arranged for aligning the focused electron beams 95 with the small apertures of the third multi-aperture plate 98 and/or to adjust for any drift of the single thermal field emission source 92, in order to ensure that the focused electron beams 95 pass through the small apertures.

In addition, the deflector 101 can also be arranged to position the focused electron beams 95 out of alignment with the apertures of the third multi-aperture plate 98, in which situation the focused electron beams 95 impinge on the third multi-aperture plate and their passage is blocked by the third multi-aperture plate. Accordingly, the deflector 101 can be used for at least temporarily stopping the electron beams 95' to reach the surface of the sample 13, without having to shut down the single thermal field emission source 92.

It is noted that the example as shown in FIG. 7, may also be provided with a deflector unit 88 as shown in FIG. 5A, which is arranged between the collimator lens 96 and the objective lens unit 97.

It is further noted, that in the example as shown in FIG. 7, the third multi-aperture plate 98 is arranged at or near the collimator lens 96. Preferably the third multi-aperture plate 98 with the array of apertures 98' is part of the collimator lens 96, as schematically depicted in the example shown in FIG. 8. The collimator lens 96 comprises the third multi-aperture plate 98 as a central planar electrode. Above and below this central planar electrode and at a distance thereof, respectively an upper electrode 101 and a lower electrode 102 is arranged, each of which comprises a central opening which is large enough for the whole array of electron beams 95, 95' to pass there through. By applying a potential difference between the upper electrode 101 and the centrally arranged third multi-aperture plate 98, and/or a potential difference between the centrally arranged third multi-aperture plate 98 and the lower electrode 102, an electrostatic field. Preferably this electrostatic field is arranged to provide a positive lens for the electron beams 95, which positive lens is arranged to have a focal point at or near the emitting position of said single thermal field emission source 92.

In an embodiment, the collimator lens 96' with an aperture plate 98' in between electrodes 101', 102' is provided with additional electrodes 101", 102" which are arranged and/or are in use driven to yield an electrostatic collimator lens 96' with zero spherical aberration or substantially zero spherical aberration.

Figure 9:
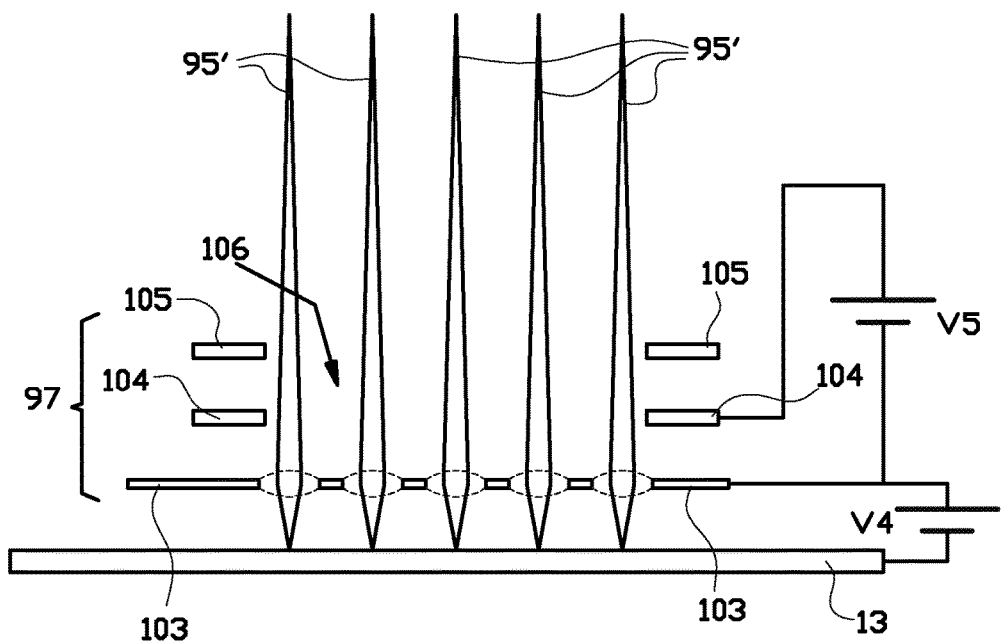
FIG. 9 schematically shows an example of an objective lens for use in any one of the examples shown in FIGS. 2, 3, 4, 5 and 6.
Figure 10:
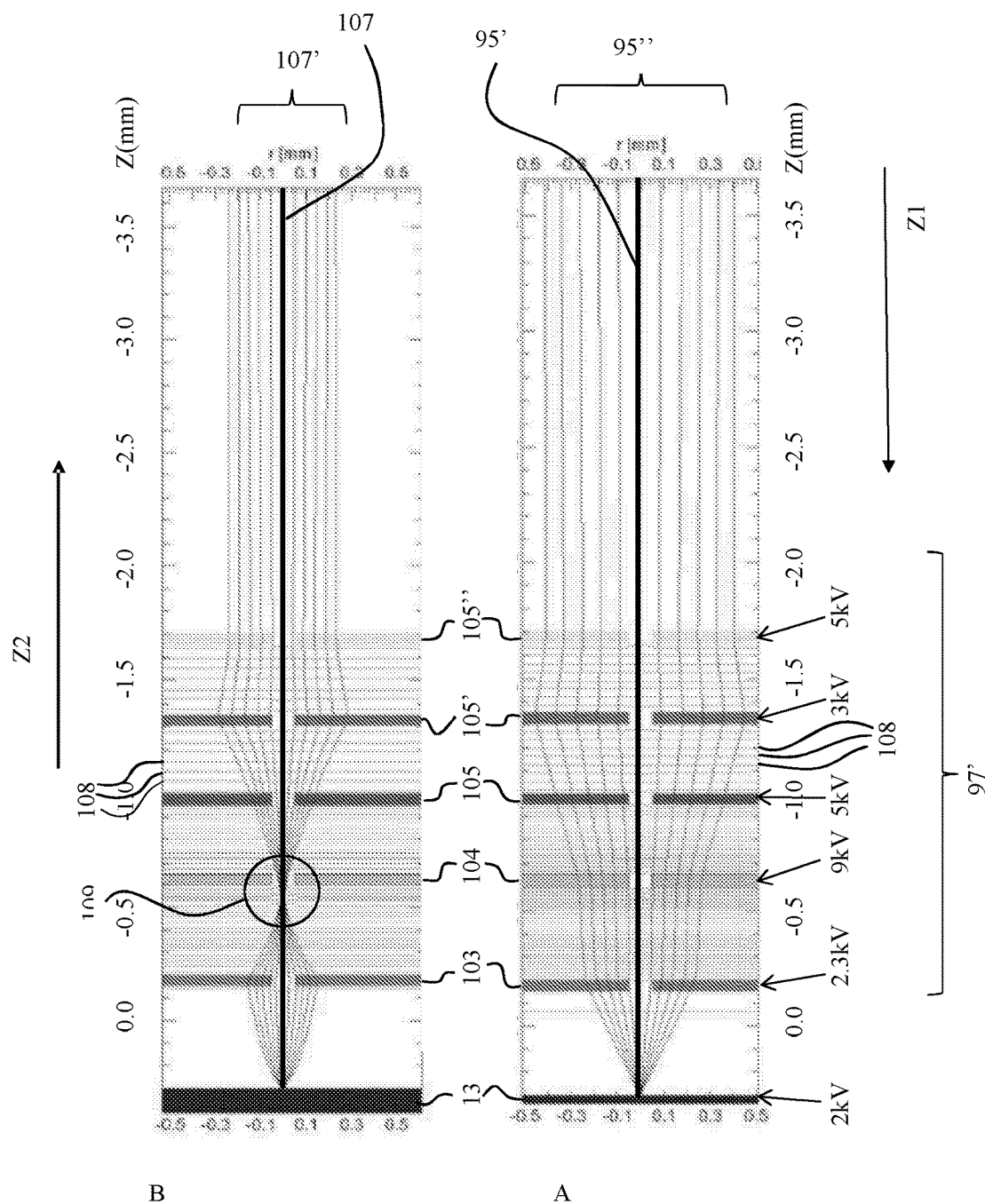
FIG. 10A schematically shows an example of an enlarged view of the trajectories of the primary electrons as they are focused on the wafer by the objective lens.
FIG. 10B schematically shows an example of an enlarged view of the trajectories of secondary electrons as they are focused back onto the detector with an additional cross-over because of the lower energy.

FIG. 9 shows an example of the objective lens unit 97 in more detail. As discussed above, the objective lens unit 97 comprises a second multi-aperture plate 103 having a through opening for each one of the electron beams 95'. At a side of said second multi-aperture plate 103 facing towards the single thermal field emission source 92, one or more further electrodes 104, 105 are arranged.

Although these further electrodes may comprise one or more multi-aperture plates having through openings which are aligned with the through openings of the second multi-aperture plate as shown in the examples in FIGS. 2, 3 and 4, the example in FIG. 9 comprises further electrodes 104, 105 having one central through opening 106 which is shared by all electron beams 95'. Such a single hole 106 common for all electron beams 95' for passing the multiple primary electron beams 95' there through, makes the alignment of the further electrodes 104, 105 with respect to the second multi-aperture plate 103 less critical.

In use, the second multi-aperture plate 103 is set at a different voltage V4 with respect to the surface of the sample 13 in order to provide an electrostatic deceleration field for the primary electrons of the multiple primary electron beams 95' between the second multi-aperture plate 103 and the surface of the sample 13. In addition, the nearest further electrode 104 arranged at a side of the second multi-aperture plate 103 facing away from the sample is set at a different voltage V5 with respect to the second multi-aperture plate 103 in order to provide an electrostatic deceleration field for the primary electrons of the multiple primary electron beams 95', between the nearest further electrode 104 and the second multi-aperture plate 103. Preferably the electrostatic deceleration field between the second multi-aperture plate 103 and the sample 13 is smaller than the electrostatic deceleration field between the nearest further electrode 104 and the second multi-aperture plate 103. This is discussed in more detail below with reference to the example as shown in FIGS. 10A and 10B.

FIGS. 10A and 10B show schematically representation of an example of an objective lens unit 97', comprising a second multi-aperture plate 103, a nearest further electrode 104, and three more further electrodes 105, 105', 105". In use, these electrodes 103, 104, 105, 105',105" are arranged at a distance z from the sample surface 13. In this example, contrarily to the example shown in FIG. 9, the further electrodes 104, 105, 105', 105" are also arranged as a multi-aperture plate having a through opening for each primary electron beam 95'.

In this example, the sample surface 13 is set at a potential of 2 kV, the second multi-aperture plate 103 is set at a potential of 2,3 kV, the nearest further electrode 104 is set at a potential of 9 kV, and the three more further electrodes 105, 105', 105" are set at a potential of 5 kV, 3 kV and 5 kV respectively.

FIG. 10A shows a simulation of the beam profile of one of the primary electron beams 95' at the objective lens unit 97'. The primary electron beam 95' travels in the direction Z1 towards the sample surface 13, substantially through the central portions of the through holes in the further electrodes 105", 105', 105, 104 and in the second multi-aperture plate 103 as indicated in FIG. 10A. In order to more clearly show the shape of the beam profile, a second representation of the primary electron beam 95" is also shown in FIG. 10A, which second representation has been highly magnified in the radial direction r. In addition FIG. 10A schematically shows field lines 108 of the electrostatic field generated by the objective lens unit 97', which electrostatic field is arranged to focus the primary electrons of the primary electron beam 95" on the surface of the sample 13.

FIG. 10B schematically shows the trajectory of secondary electrons which are generated by the primary electrons when they impinge on the surface of the sample 13. The same electrostatic field which decelerates the primary electrons between the nearest further electrode 104 and the second multi-aperture plate 103, and which decelerates the primary electrons between the second multi-aperture plate 103 and the surface of the sample 13, accelerates the secondary electrons away from the surface of the sample 13 towards the second multi-aperture plate 103, and provides a secondary electron beam 107 which travels in a direction Z2, substantially opposite to the direction Z1 of travel of the primary electron beam 95'.

In order to more clearly show the shape of the beam profile of the secondary electron beam 107, a second representation of the secondary electron beam 107' is also shown in FIG. 10B, which second representation has been highly magnified in the radial direction r. Due to the lower energy of the secondary electrons with respect to the primary electrons, the electrostatic field provided by the objective lens unit 97' provides the secondary electron beam 107' with an additional cross-over 109 as compared to the primary electron beam 95". In the example showed in FIG. 10B, the additional cross-over 109 is arranged between the second multi-aperture plate 103 and the nearest further electrode 104, in particular near the nearest further electrode 104. The three more further electrodes 105, 105', 105" are arranged to project the secondary electron beam 107' onto the multi-sensor detector system as schematically shown in FIGS. 1, 2, 3 and 4.

Figure 10C:
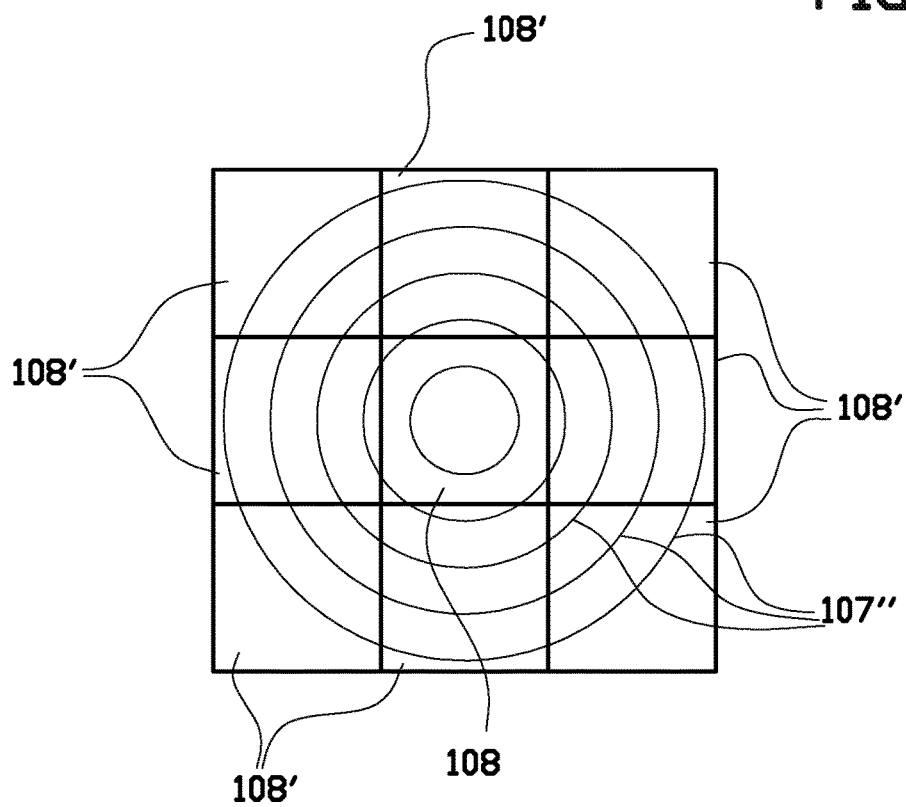
FIG. 10C schematically shows an example of the beam spot of the secondary electron beam of FIG. 10B on a multi-sensor detector.

In the example as shown in FIG. 10B the secondary electron beam 107' is substantially collimated when leaving the objective lens unit 97'. When this secondary electron beam 107' is projected onto the multi-sensor detector system, and the spot 107" of the secondary electron beam 107' covers multiple sensors 108, 108' of said multi-sensor detector as shown schematically in FIG. 10C, the multi-sensor detector can obtain also information about an intensity distribution within the spot 107" of the secondary electron beam 107'. In particular, the sensors 108', which are arranged around the central part of the spot 107", detect the secondary electrons at the edge of spot 107" of the secondary electron beam 107' which may contain information about a gradient or slope of the surface of the sample 13 at the position on the sample 13 where the secondary electron beam 107' originates from. In addition, by using the off-center sensors 108' a dark-field image of the sample can be reconstructed.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In summary, the present invention relates to an assembly for inspecting the surface of a sample. The assembly comprises two or more multi-beam electron column units. Each unit comprises:

a single field emitter for emitting a diverging electron beam towards a beam splitter, wherein the beam splitter comprises a first multi-aperture plate comprising multiple apertures for creating multiple primary electron beams, a collimator lens for collimating the diverging electron beam from the emitter, an objective lens unit for focusing said multiple primary electron beams on said sample, and a multi-sensor detector system for separately detecting the intensity of secondary electron beams created by each one of said focused primary electron beams on said sample. The two or more multi-beam electron column units are arranged adjacent to each other for inspecting different parts of the surface of the sample at the same time.

The invention claimed is:

1. An assembly for inspecting the surface of a sample, wherein the assembly comprises two or more multi-beam electron column units, each multi-beam electron column unit comprising:
a single thermal field emission source for emitting a diverging electron beam towards a beam splitter,
wherein the beam splitter comprises a first multi-aperture plate comprising multiple apertures which are arranged for creating multiple primary electron beams, one primary electron beam per aperture of said first multiple apertures,
a collimator lens for substantially collimating the diverging electron beam from the emitter,
an objective lens unit for focusing said multiple primary electron beams on said sample, wherein the objective lens unit comprises a second electrostatic lens array for focusing said multiple primary electron beams on the surface of the sample, wherein the second electrostatic lens array comprises at least a second multi-aperture plate, wherein substantially each aperture of said second multi-aperture plate in use comprises an electrostatic lens, and
a multi-sensor detector system for separately detecting the intensity of secondary electron beams created by each one of said focused primary electron beams on said sample,
wherein said two or more multi-beam electron column units are arranged adjacent to each other, and are arranged to focus their multiple primary electron beams onto the surface of the sample for inspecting different parts of the surface of the sample at the same time.

2. The assembly according to claim 1, wherein at least one of the two or more multi-beam electron column units comprises a single signal processing unit which is connected to the multi-sensor detector system of said one of the two or more multi-beam electron column units.

3. The assembly according to claim 2, wherein said one of the two or more multi-beam electron column units is connected to a central signal processing unit of the assembly via a single signal line.

4. The assembly according to claim 1, wherein the beam splitter comprises a first electrode which together with the first multi-aperture plate provides a first electrostatic lens array, wherein substantially each aperture of said first multi-aperture plate in use comprises an electrostatic lens, and wherein the electrostatic lenses of the first electrostatic lens array are arranged to focus the multiple primary electron beams in a first focus plane.

5. The assembly according to claim 4, wherein the first focus plane is arranged in or near the collimator lens unit.

6. The assembly according to claim 1, wherein said second electrostatic lens array comprises a second electrode at a distance from the second multi-aperture plate, wherein said second electrode comprises a single hole for passing said multiple primary electron beams there through.

7. The assembly according to claim 1, wherein said second multi-aperture plate, in use, is set at a different voltage from the surface of the sample in order to provide an electrostatic deceleration field for the primary electrons between the second multi-aperture plate and the surface of the sample, which is smaller than an electrostatic deceleration field between the second electrode and the second multi-aperture plate.

8. The assembly according to claim 1, wherein each multi-beam electron column unit further comprising an electro-magnetic deflection unit for aligning the multiple primary electron beams from said beam splitter onto the centers of the lenses in said second electrostatic lens array.

9. The assembly according to claim 8, wherein the electro-magnetic deflection unit is arranged for providing a substantial equal deflection for all primary electron beams of said multiple primary electron beams.

10. The assembly according to claim 1, wherein the collimator lens is a combined magnetic and electrostatic collimator lens for adjusting the pitch and rotation of the multiple primary electron beams created by said beam splitter to the pitch and rotation position of the centers of the lenses in said second electrostatic lens array.

11. The assembly according to claim 1, wherein said multi-beam electron columns comprise an array of individually adjustable deflection elements for steering the multiple primary electron beams from said beam splitter onto the centers of the lenses in said second electrostatic lens array.

12. The assembly according to claim 1, wherein at least in use each lens of the second electrostatic lens array is arranged to focus the secondary electrons from the sample on to the multi-sensor detector with one additional crossover as compared to a primary electron beam.

13. The assembly according to claim 1, wherein each of said multi-beam electron column units comprise an electromagnetic deflection system between said collimator lens and said objective lens unit for deflecting the secondary electron beams towards said multi-sensor detector system.

14. The assembly according to claim 13, wherein the electro-magnetic deflection system is arranged for deflecting said secondary electron beams over an angle between 1 and 20 degrees, preferably over an angle of approximately 3 degrees.

15. The assembly according to claim 1, wherein said multi-sensor detector system comprises:
a fluorescent plate which is arranged for receiving the secondary electron beams and for generating a substantially separate light emitting spot for each one of said secondary electron beams, and
a mirror for imaging the light emitting spots on a multi-sensor detector.

16. The assembly according to claim 1, wherein said multi-sensor detector system comprises:
a fluorescent plate or layer which is arranged for receiving the secondary electron beams and for generating a substantially separate light emitting spot for each one of said secondary electron beams,
an array of optical fibers, wherein said fluorescent plate or layer is arranged adjacent or is attached to a first end of said array of optical fibers for coupling light from said substantially separate light emitting spots into the optical fibers, and
a multi-sensor detector which is coupled to a second end of said array of optical fibers, opposite to said first end.

17. The assembly according to claim 15, wherein the multi-sensor detector comprises a multi-pixel light detector.

18. The assembly according to claim 1, wherein said multi-sensor detector comprises a direct multi-pixel electron detector.

19. The assembly according to claim 1, wherein each multi-beam electron column unit comprises a third multi-aperture plate arranged at or near the first focus plane, wherein said third multi-aperture plate comprises multiple apertures which are arranged for passing the focused electron beams there through, one focused electron beam per aperture of said third multiple apertures.

20. The assembly according to claim 19, wherein each multi-beam electron column unit comprises a chamber, wherein said single thermal field emission source and said beam splitter are arranged inside said chamber, and wherein said second multi-aperture plate provides a wall of said chamber.

21. The assembly according to claim 20, wherein said chamber is connected to or comprises a vacuum pump, wherein said vacuum pump preferably comprises an ion pump.

22. The assembly according to claim 1, wherein each multi-beam electron column unit comprises a deflector at or near the single thermal field emission source.

23. The assembly according to claim 1, wherein said multi-beam electron columns occupy a surface area above the surface of said sample in a range of $20\times20$ mm$^2$ to $60\times60$ mm$^2$, preferably approximately $26\times32$ mm$^2$.

24. The assembly according to claim 1, wherein a pitch of said focused multiple primary electron beams on the surface of the sample is in a range from 50 to 500 µm, preferably approximately 150 µm.

25. A multi-beam electron column unit for inspecting the surface of a sample, wherein the multi-beam electron column unit comprises:
  a single thermal field emission source for emitting a diverging electron beam towards a beam splitter,
  wherein the beam splitter comprises a first multi-aperture plate comprising multiple apertures which are arranged for creating multiple primary electron beams, one primary electron beam per aperture of said first multiple apertures, wherein the beam splitter comprises a first electrode which together with the first multi-aperture plate provides a first electrostatic lens array, wherein substantially each aperture of said first multi-aperture plate in use comprises an electrostatic lens, and wherein the electrostatic lenses of the first electrostatic lens array are arranged to focus the multiple primary electron beams in a first focus plane,
  a further multi-aperture plate arranged at or near the first focus plane, wherein said further multi-aperture plate comprises multiple apertures which are arranged for passing the focused primary electron beams there through, one focused electron beam per aperture of said third multiple apertures,
  a collimator lens for substantially collimating the diverging electron beam from the emitter,
  an objective lens unit for focusing said multiple primary electron beams on said sample, and
  a multi-sensor detector system for separately detecting the intensity of secondary electron beams created by each one of said focused primary electron beams on said sample,
  wherein the multi-beam electron column unit comprises a chamber, wherein said single thermal field emission source and said beam splitter are arranged inside said chamber, and wherein said further multi-aperture plate provides a wall of said chamber.

26. The multi-beam electron column unit according to claim 25, wherein said chamber is connected to or comprises a vacuum pump.

27. A multi-beam electron column unit for inspecting the surface of a sample, wherein the multi-beam electron column unit comprises:
  a single thermal field emission source for emitting a diverging electron beam towards a beam splitter,
  wherein the beam splitter comprises a first multi-aperture plate comprising multiple apertures which are arranged for creating multiple primary electron beams, one primary electron beam per aperture of said first multiple apertures,
  a collimator lens for substantially collimating the diverging electron beam from the emitter,
  an objective lens unit for focusing said multiple primary electron beams on said sample, and
  a multi-sensor detector system for separately detecting the intensity of secondary electron beams created by each one of said focused primary electron beams on said sample,
  wherein said multi-beam electron column unit comprises a deflector at or near the single thermal field emission source, wherein said deflector is arranged for correcting a drift of said emission source.

28. A method for inspecting the surface of a sample comprising the steps of:
  (A) providing an assembly which comprises two or more multi-beam electron column units, each of said two or more multi-beam electron column units comprising:
    a single thermal field emission source for emitting a diverging electron beam towards a beam splitter,
    wherein the beam splitter comprises a first multi-aperture plate comprising multiple apertures which are arranged for creating multiple primary electron beams, one primary electron beam per aperture of said first multiple apertures,
    a collimator lens for substantially collimating the diverging electron beam from the emitter,
    an objective lens unit for focusing said multiple primary electron beams on said sample, wherein the objective lens unit comprises a second electrostatic lens array for focusing said multiple primary electron beams on the surface of the sample, wherein the second electrostatic lens array comprises at least a second multi-aperture plate, wherein substantially each aperture of said second multi-aperture plate in use comprises an electrostatic lens, and
    a multi-sensor detector system for separately detecting the intensity of secondary electron beams created by each one of said focused primary electron beams on said sample, and
    wherein said two or more multi-beam electron column units are arranged adjacent to each other, and are arranged to focus their multiple primary electron beams onto the surface of the sample for inspecting different parts of the surface of the sample at the same time;
  (B) emitting a diverging electron beam towards the beam splitter using the single thermal field emission source;
  (C) creating multiple primary electron beams using the beam splitter;
  (D) collimating the diverging electron beam from the emitter using the collimator lens;
  (E) focusing said multiple primary electron beams on said sample using the objective lens unit; and
  (F) separately detecting the intensity of secondary electron beams created by each one of said focused primary electron beams on said sample using the multi-sensor detector system.

29. A method for inspecting the surface of a sample comprising the steps of:
(A) providing a multi-beam electron column unit, wherein the multi-beam electron column unit comprises:
a single thermal field emission source for emitting a diverging electron beam towards a beam splitter,
wherein the beam splitter comprises a first multi-aperture plate comprising multiple apertures which are arranged for creating multiple primary electron beams, one primary electron beam per aperture of said first multiple apertures, wherein the beam splitter comprises a first electrode which together with the first multi-aperture plate provides a first electrostatic lens array, wherein substantially each aperture of said first multi-aperture plate in use comprises an electrostatic lens, and wherein the electrostatic lenses of the first electrostatic lens array are arranged to focus the multiple primary electron beams in a first focus plane,
a further multi-aperture plate arranged at or near the first focus plane, wherein said further multi-aperture plate comprises multiple apertures which are arranged for passing the focused primary electron beams there through, one focused electron beam per aperture of said third multiple apertures,
a collimator lens for substantially collimating the diverging electron beam from the emitter,
an objective lens unit for focusing said multiple primary electron beams on said sample, and
a multi-sensor detector system for separately detecting the intensity of secondary electron beams created by each one of said focused primary electron beams on said sample,
wherein the multi-beam electron column unit comprises a chamber, wherein said single thermal field emission source and said beam splitter are arranged inside said chamber, and wherein said further multi-aperture plate provides a wall of said chamber;
(B) emitting a diverging electron beam towards the beam splitter using the single thermal field emission source;
(C) creating multiple primary electron beams using the beam splitter and focusing the multiple primary electron beams in the first focus plane;
(D) passing the focused primary electron beams through the further multi-aperture plate arranged at or near the first focus plane;
(E) collimating the diverging electron beam from the emitter using the collimator lens;
(F) focusing said multiple primary electron beams on said sample using the objective lens unit; and
(G) separately detecting the intensity of secondary electron beams created by each one of said focused primary electron beams on said sample using the multi-sensor detector system.

30. The assembly according to claim 16, wherein the multi-sensor detector comprises a multi-pixel light detector.

31. A method for inspecting the surface of a sample comprising the steps of:
(A) providing a multi-beam electron column unit, comprising:
a single thermal field emission source for emitting a diverging electron beam towards a beam splitter;
wherein the beam splitter comprises a first multi-aperture plate comprising multiple apertures which are arranged for creating multiple primary electron beams, one primary electron beam per aperture of said first multiple apertures,
a collimator lens for substantially collimating the diverging electron beam from the emitter,
an objective lens unit for focusing said multiple primary electron beams on said sample; and
a multi-sensor detector system for separately detecting the intensity of secondary electron beams created by each one of said focused primary electron beams on said sample,
wherein said multi-beam electron column unit comprises a deflector at or near the single thermal field emission source, wherein said deflector is arranged for correcting a drift of said emission source;
(B) emitting a diverging electron beam towards the beam splitter using the single thermal field emission source;
(C) creating multiple primary electron beams using the beam splitter;
(D) collimating the diverging electron beam from the emitter using the collimator lens;
(E) focusing said multiple primary electron beams on said sample using the objective lens unit;
(F) separately detecting the intensity of secondary electron beams created by each one of said focused primary electron beams on said sample using the multi-sensor detector system; and
(G) correcting a drift of said emission source of said multi-beam electron column unit using the deflector at or near the single thermal field emission source.

* * * * *